United States Patent

Sakamoto et al.

Patent Number: 6,034,393
Date of Patent: Mar. 7, 2000

[54] NONVOLATILE SEMICONDUCTOR MEMORY DEVICE USING TRENCH ISOLATION AND MANUFACTURING METHOD THEREOF

[75] Inventors: Osamu Sakamoto; Natsuo Ajika, both of Hyogo, Japan

[73] Assignee: Mitsubishi Denki Kabushiki Kaisha, Tokyo, Japan

[21] Appl. No.: 08/982,212

[22] Filed: Dec. 1, 1997

[30] Foreign Application Priority Data

Jun. 16, 1997 [JP] Japan .................................. 9-158561

[51] Int. Cl.⁷ .................................................. H01L 29/788
[52] U.S. Cl. .......................... 257/315; 257/321; 257/506; 257/510
[58] Field of Search ..................... 257/315, 321, 257/506, 510

[56] References Cited

U.S. PATENT DOCUMENTS 5,559,048  9/1996  Inoue ........................................ 438/257
5,844,270  12/1998  Kim et al. ................................ 257/315

FOREIGN PATENT DOCUMENTS 8-17948   1/1996  Japan.
8-97275   4/1996  Japan.
9-8156    1/1997  Japan.

OTHER PUBLICATIONS

"A Novel Side–Wall Transfer–Transistor Cell (Swatt Cell) For . . . ", Seiichi Aritome, et al., IEDM 95, pp. 275–278.
"A Shallow–Trench–Isolation Flash Memory Technology with . . . ", Masataka Kato, et al., IEDM 96, pp. 177–180.

Primary Examiner—Jerome Jackson, Jr.
Assistant Examiner—George C. Eckert, II
Attorney, Agent, or Firm—McDermott, Will & Emery

[57] ABSTRACT

A nonvolatile semiconductor memory device with trench isolation having sufficient capability of isolating memory cells is provided. A trench formed as a line in the main surface of semiconductor substrate is filled with a first insulating film. On semiconductor substrate on both sides of trench, a first gate electrode is provided with a first oxide film interposed. On the first gate electrode, a second gate electrode is provided with a second insulating film interposed. An angle formed by a side wall upper surface of trench and the surface of semiconductor substrate is smaller than 90°.

6 Claims, 16 Drawing Sheets

NONVOLATILE SEMICONDUCTOR MEMORY DEVICE USING TRENCH ISOLATION AND MANUFACTURING METHOD THEREOF

BACKGROUND OF THE INVENTION

1. Field of the Invention

The present invention generally relates to a nonvolatile semiconductor memory device using trench isolation. The present invention also relates to a method of manufacturing such a nonvolatile semiconductor memory device.

2. Description of the Background Art

FIG. 12 is a plan view of a conventional nonvolatile semiconductor device using trench isolation. FIG. 13 is a cross section taken along the line A—A of FIG. 12. FIG. 14 is a cross section taken along the line B—B of FIG. 12.

Referring to these figures, the conventional nonvolatile semiconductor memory device includes a semiconductor substrate 101. On a main surface of semiconductor substrate 101, trenches 105 for trench isolation are formed as lines. A thick oxide film 106 is provided on semiconductor substrate 101 to fill trench 105. Trench isolation is provided by trench 105 and thick oxide film 106 filled therein. On semiconductor substrate 101 on both sides of trench 105, a floating gate 103 is formed, with a tunnel oxide film 102 interposed. On floating gate 103, a control gate 109 is provided, with an interpoly insulation film 108 interposed.

Referring to FIG. 15, operation of the nonvolatile semiconductor memory device will be described. Here, the method of Channel Hot Electron writing, Fowler-Nordheim tunneling current erasure, which are common in the 1M to 16M first generation will be described.

Information is stored dependent on whether the floating gate is charged or not. When electrons are injected to the floating gate and the gate is charged negative, Vth viewed from the control gate thereon becomes higher (writing state). By contrast, when the floating gate is not charged negative, Vth is low (erased stated). Stored content can be read by determining whether or not the transistor turns ON when a potential intermediate between these Vth values is applied to the control gate.

Writing can be done on a per byte basis by selecting drain interconnection and gate interconnection. However, selective application of erasing voltage is not possible. Therefore, erasure has to be done on all the bits simultaneously.

Since the floating gate electrode is surrounded by an insulating film of high quality, injected electrons remain in the electrode unless they are erased. Therefore, the stored content is maintained even when power is turned off.

A method of manufacturing a conventional nonvolatile semiconductor memory device using trench isolation will be described in the following.

Referring to FIG. 16, tunnel oxide film 102 is formed on the surface of a semiconductor substrate (silicon semiconductor substrate) 101 and floating gate 103 is deposited on tunnel oxide film 102. Floating gate 103 is generally formed using polycrystalline silicon containing an impurity such as P (phosphorus) as its material. Thereafter, using photolithography, a resist pattern 104 having a desired width of removal x1 and width of remaining portion x2 along the direction X is formed.

Referring to FIGS. 17 and 18, using resist pattern 104 as an etching mask, floating gate 103, tunnel oxide film 102 and the surface of silicon semiconductor substrate 101 are successively dry etched. A trench having a desired depth y is formed in silicon semiconductor substrate 101, thus forming trench 105. FIG. 17 show a state in the middle of the process. FIG. 18 shows the state at the end of dry etching.

Referring to FIG. 19, thick oxide film 106 is deposited on silicon semiconductor substrate 101 to fill trench 105.

Referring to FIGS. 19 and 20, thick oxide film 106 is removed by CMP (Chemical Mechanical Polishing), using floating gate 103 as a stopper film or dry etch, until the position of the upper surface of thick oxide film 106 becomes flush with the upper surface of floating gate 103. Consequently, thick oxide film 106 fills trench 105, and trench isolation 107 having the width of isolation x1 is completed.

Referring to FIG. 21, interpoly insulation film 108 and control gate 109 are deposited successively.

Thereafter, referring to FIGS. 12 and 21, control gate 109 is etched to have a desired width of removal and desired width of the remaining portion along the direction Y orthogonal to the direction X, using interpoly insulation film 108 therebelow as a stopper film (the change does not appear in FIG. 21). Thereafter, interpoly insulation film 108 and floating gate 103, which are exposed at the portion where control gate 109 is removed by etching, are etched, and a memory cell 110 of a nonvolatile semiconductor memory device is completed. The width of floating gate 103 of the thus formed memory cell 110 is x2, as shown in FIG. 21.

The first problem experienced by the conventional nonvolatile semiconductor memory device (first prior art example) manufactured through the method shown in FIGS. 16 to 21 will be described in the following.

Currently, market for portable telephone, digital still camera and so on for which nonvolatile semiconductor memory device is used has been ever widening. Therefore, demand for the nonvolatile semiconductor memory devices has been increased, and increased storage capacity has been required. In order to increase storage capacity of the nonvolatile semiconductor memory device, increase in the chip size must be minimized. The reason is that PDAs (Personal Digital Assistant) such as personal telephones and digital still camera for which the memory device is used are mostly compact and handy, and hence the nonvolatile semiconductor memory device as an LSI (Large Scale Integrated Circuit) used as the component must also be small in size. Unless the size of memory cell 110, that is, width x2 of floating gate 103, width x1 of trench isolation, the width of control gate 109 and so on is much reduced, the product could not be commercially competitive in view of cost.

However, when the width of removal x1 and the width of the remaining portion x2 of resist pattern 104 from which the width x1 of trench isolation 107 and width x2 of floating gate 103 are defined come nearer to the resolution of photolithography, it becomes difficult to form resist pattern 104 having desired width of removal x1 and the width of the remaining portion x2 having good shape as shown in FIG. 16. With resist pattern 104 of unsatisfactory shape not having desired width of removal and the width of the remaining portion, the target width x1 of trench isolation 107 and target width x2 of floating gate 103 cannot be obtained. In the worst case, memory cell 110 may not function normally.

In such a case, the thickness of resist itself may be reduced, so as to form resist pattern 104 having a good shape with desired width of removal x1 and desired width of the remaining portion x2. However, in that case, when a trench having a desired depth y is etched in silicon semiconductor substrate 101 and trench 105 is formed, there is not the resist 104 left thereon, as shown in FIG. 18. As a result, floating gate 103 shown in FIG. 18 is etched and, as a result, it becomes thinner than floating gate 103 shown in FIG. 16. The silicon semiconductor substrate 101 is formed of silicon single crystal and generally, floating gate 103 is formed of polycrystalline silicon which is the same element as silicon semiconductor substrate 101. Therefore, under the etching condition for etching silicon semiconductor substrate 101, that is, silicon single crystal, the floating gate 103 tends to be etched as it is formed of polycrystalline silicon. Therefore, as soon as resist pattern 104 is removed, floating gate 103 is subjected to etching. As a result, floating gate 103 can still have thin film thickness as shown in FIG. 18 and the surface of floating gate 103 and inner portion of floating gate 103 near the surface may be damaged by plasma used for dry etching.

Further, even when resist pattern 104 having good shape with desired width of removal x1 and desired width of the remaining portion x2 (such as shown in FIG. 16) could be resolved with thick resist film, resist pattern 104 would still be removed completely before forming trench 105 of the desired depth y, if the ratio of etching rate of films to be dry etched in forming trench 105 (that is, floating gate 103, tunnel oxide film 102 and silicon semiconductor substrate 101) and the etching rate of resist pattern 104 is small. This may result in dry etching of floating gate 103. Consequently, floating gate 103 comes to have thin film thickness as shown in FIG. 18, and as described above, the surface of floating gate 103 and inner portion of floating gate 103 near the surface are damaged by the plasma for dry etching.

Referring to FIGS. 19 and 20, when thick oxide film 106 deposited in trench 105 or floating gate 103 is to be removed by the CMP method so as to fill trench 105 with thick oxide film 106, floating gate 103 is made thinner to be the thin floating gate 103 as shown in FIG. 20, since the etching rate of floating gate 103 formed of polycrystalline silicon under the CMP method is faster than the etch rate of thick oxide film 106 under the CMP method. At this time, floating gate 103 is not only physically etched by the CMP method but it has its surface exposed to an alkali solution used in the CMP. Therefore, the upper surface of floating gate 103 and inner portion of floating gate 103 near the upper surface are physically and chemically damaged.

When thick oxide film 106 is to be filled in trench 105 not by the CMP method but by dry etch back method, the upper surface of floating gate 103 is exposed to etching plasma in the dry etch back method. Therefore, the upper surface of floating gate 103 and inner portion of floating gate 103 near the upper surface suffer from plasma damage of dry etching.

The conventional nonvolatile semiconductor memory device manufactured through the steps shown FIGS. 16 to 21 also has the following second problem.

Referring to FIG. 18, while floating gate 103, tunnel oxide film 102 and silicon semiconductor substrate 101 are being etched for forming trench 105, resist pattern 104 is also etched at the same time. Therefore, the surface of floating gate 103 and inside of the trench formed in silicon semiconductor substrate 101 are contaminated by carbon or the like coming out from the resist mainly formed of an organic substance.

As described above, in the nonvolatile semiconductor memory device manufactured by the method shown in FIGS. 16 to 21, the surface of floating gate 103 and inner portion of floating gate 103 near the surface are damaged by the etching plasma during dry etching when the trench is formed. The floating gate is physically damaged by etching and chemically damaged by alkali solution (in case of CMP method) or damaged at the upper surface of floating gate 103 and inner portion of floating gate 103 near the upper surface by etching plasma (in case of dry etching back method), when the thick oxide film is etched by the CMP method or dry etch back method. These damages have undesirable influence on the subsequently formed interpoly insulation film. This may possibly leads to unsatisfactory retention which is one of the defective modes of the nonvolatile semiconductor memory device.

Further, when the trench is formed, the resist pattern is also etched simultaneously. Therefore, contaminant such as carbon which is a main component of the resist adheres on the side wall or a bottom portion of the trench formed in silicon semiconductor substrate and on the surface of the floating gate. The contaminant such as carbon which is a main component of the resist may enter the inner portion of the floating gate near the surface of the floating gate, and inner portion of the silicon semiconductor substrate near side walls and bottom surfaces of a trench formed in the silicon semiconductor substrate, because of knocking by the etching particles. The contaminant such as carbon which entered the inner portion near the surface of the floating gate has undesirable influence on the subsequently formed interpoly insulation film, causes unsatisfactory retention. The contaminant such as carbon adheres on the side wall or bottom portion of the trench formed in the silicon semiconductor substrate and the contaminant such as carbon which entered the inner portion near the surface of the side wall or the bottom portion of the trench causes the impurity defect, degrading junction breakdown voltage or forming a leak current path, which may degrade capability of isolation (punch-through margin) between adjacent memory cells.

A second prior art example will be described in the following. The second prior art example which will be described in the following has been proposed to avoid plasma damage at the time of dry etching and physical and chemical damages by the CMP method on the floating gate and to avoid contamination by carbon or the like in the trench formed in the silicon semiconductor substrate and the surface of floating gate, experienced in the first prior art example.

Referring to FIG. 22, a tunnel oxide film 202 is formed on a surface of a silicon semiconductor substrate 201, and a floating gate 203 is deposited with a tunnel oxide film 202 interposed. Thereafter, a silicon nitride film 211 of which etching rate under the CMP method is slower than the oxide film is deposited on floating gate 203. Silicon nitride film 211 serves as a stopper film in the CMP method and a hard mask at the time of etching of trench 205 as will be described later. Here, the term hard mask is opposed to term resist mask (which is formed of an organic substance), and the hard mask refers to an etching mask of which main component is not an organic substance but an inorganic substance. Thereafter, by photolithography, a resist pattern 204 having a desired width x1 for removal and x2 to be left along the direction X is formed in good shape.

Referring to FIGS. 22 and 23, using resist pattern 204 as an etching mask, silicon nitride film 211 is dry etched, so that silicon nitride film 211 of a good shape having a desired width x1 for removal and desired width x2 to be left is formed.

Referring to FIG. 24, using silicon nitride film 211 as a hard mask, a trench having a desired depth y is formed in silicon semiconductor substrate 201 by successively dry etching floating gate 203, tunnel oxide film 202, and silicon semiconductor substrate 201, and thus trench 205 is formed.

At this time, as shown in FIG. 24, the hard mask formed of an inorganic substance, that is, silicon nitride film 211 is also made thinner to some extent. The reason for this is that the etching rate of tunnel oxide film 202 formed of an oxide of silicon element in dry etching is not much different from the etching rate of silicon nitride film which is a material of the hard mask in dry etching, or that it is difficult to find an etching condition which can differentiate the etching rates. Accordingly, when tunnel oxide film 202 is etched, silicon nitride film 211 shown in FIG. 23 is also etched to some extent.

However, contamination of the surface of floating gate 103 and in the trench 105 formed in silicon semiconductor substrate 101 experienced in the first prior art example and shown in FIG. 18 can be avoided as a hard mask formed of an inorganic substance, that is, silicon nitride film 211, is used. Further, since there is a floating gate 203 below silicon nitride film 211, floating gate 203 is not etched during dry etching. Therefore, floating gate 203 is not made thin, and floating gate 203 is free from plasma damage during dry etching. Referring to FIG. 25, thick oxide film 206 is deposited on silicon semiconductor substrate 101 until trench 205 is filled.

Referring to FIGS. 25 and 26, thick oxide film 206 is removed until the position of the upper surface of thick oxide film 206 is flush with the upper surface of silicon nitride film 211, using silicon nitride film 211 as a stopper film of the CMP method, so that trench 205 is filled with thick oxide film 206. The step shown in FIG. 26 shows removal of thick oxide film 206 by the CMP method. However, thick oxide film 206 may be filled in trench 205 by dry etch back method.

At this time, since silicon nitride film 211 of which etching rate in the CMP method is slower than that of the oxide film functions as a stopper film in the CMP method and there is floating gate 203 below silicon nitride film 211, floating gate 203 is not etched and is not made thin in the CMP method. Therefore, floating gate 203 is neither physically damaged by etching in CMP method nor damaged chemically by the alkali solution.

The same applies to the case where thick oxide film 206 is filled in trench 205 by dry etch back method. More specifically, even when dry etch back method is used, the upper surface of floating gate 203 is not exposed to etching plasma, and therefore the upper surface of floating gate 203 and inner portion of floating gate 203 ear the upper surface are not damaged by plasma during etching.

In FIG. 26, silicon nitride film 211 is shown considerably thinner than silicon nitride film 211 of FIG. 25. This shows that etching is performed considerably by the CMP method so as to sufficiently remove thick oxide film 206 and accordingly silicon nitride film 211 is also made thin, by the CMP method. Though silicon nitride film 211 is made thinner, floating gate 203 is not made thinner. Further, floating gate 203 is not physically or chemically damaged by the CMP method.

Referring to FIG. 27, unnecessary silicon nitride film 211 is removed. Silicon nitride film 211 is removed by hot phosphoric acid. The reason for this is that when silicon nitride film 211 is removed by dry etching, floating gate 203 is damaged by the plasma during dry etching.

At this time, floating gate 203 formed of polycrystalline silicon and including impurity such as P is exposed to hot phosphoric acid. Therefore, the surface of floating gate 203 is made rough, and comes to have small recesses and protrusions.

Referring to FIGS. 27 and 28, the upper surface of thick oxide film 206 protruding upward than the surface of floating gate 203 is wet etched by the thickness w by hydrofluoric acid solution, and the upper surface of thick oxide film 206 is made lower by the thickness z than the upper surface of the floating gate 203. Thus, thick oxide film 206 is filed in trench 205, and trench isolation 207 having the isolation width x1 is completed.

Referring to FIG. 29, interpoly insulation film 208 and control gate 209 are deposited successively. Thereafter, control gate 209 is etched to have desired width for removal and desired width to be left in a direction Y orthogonal to the direction X, using the underlying interpoly insulation film 208 as a stopper film. Thereafter, interpoly insulation film 208 and floating gate 203 exposed at portions where control gate 209 is etched, and a memory cell 210 of the nonvolatile semiconductor memory device is formed. The width of the floating gate 203 of the thus formed memory cell 210 is x2.

Referring to FIG. 29, the reason why the upper surface of thick oxide film 206 is made lower by the thickness z than the upper surface of floating gate 203 will be described.

A nonvolatile semiconductor memory device such as an EPROM, EEPROM and a flash memory controls amount of charges in floating gate 203 and information represented by two values, that is "0" and "1" is stored dependent on whether the threshold voltage of memory cell 210 is high or low (the threshold voltage is generally represented by the reference character Vth, which means the control gate voltage $V_{cg}$ at the time when a certain current flows to the channel of semiconductor substrate 201 by application of a voltage to control gate 209).

FIG. 31 is a schematic equivalent circuit diagram of memory cell 210 shown in FIG. 29. The equivalent circuit of memory cell 210 shown in FIG. 31 is represented by a series connection of a capacitance Ccf213 between control gate 209 and floating gate 203 and capacitance Cfs214 between floating gate 203 and silicon semiconductor substrate 201. Capacitance Ccf is determined by the thickness, area and permittivity of interpoly insulation film 208 between control gate 209 and floating gate 203. Capacitance Cfs is determined by the thickness, area and permittivity of tunnel oxide film 202 between floating gate 203 and silicon semiconductor substrate 201.

When memory cell 210 is an n type memory cell, the threshold voltage Vth of memory cell 210 can be made higher by the following manner. Potential difference between floating gate voltage Vfg and substrate voltage Vsub of the silicon semiconductor substrate is set to be Vfg>Vsub, an electric field applied to tunnel oxide film 202 between floating gate 203 and silicon semiconductor substrate 201 is increased to be large enough to cause an N (Fowler-Nordheim) tunneling current, and electrons are injected and accumulated through tunnel oxide film 202 to floating gate 203. This is one method of injecting electrons to floating gate 203. There are also other methods of injecting electrons to floating gate 203.

Floating gate 203 is surrounded by some insulation film entirely. Therefore, it is not possible to control floating gate voltage Vfg by directly applying a voltage to floating gate 203. In order to change floating gate voltage Vfg, control gate voltage Vcg is changed. Floating gate voltage Vfg in the absence of any charges in floating gate 203 is represented by the following equation using control gate voltage Vcg, capacitance Ccf between control gate 209 and floating gate 203 and capacitance Cfs between floating gate 203 and semiconductor substrate 201.

$$V_{fg} = V_{cg} \times [C_{cf} \div (C_{cf} + C_{fs})]$$

$$C_{cf} \div (C_{cf} + C_{fs}) = C_p$$

where Cp is generally referred to as a coupling ratio.

It can be understood from the equation above that when capacitance Ccf213 between control gate 209 and floating gate 203 is increased, that is, when coupling ratio Cp is made close to 1, it is possible to inject electrons through tunnel oxide film 202 to floating gate 203. Floating gate voltage Vfg necessary for increasing the electric field to be applied to tunnel oxide film 202 to that extent can be obtained without much increasing control gate voltage Vcg. The reason for this is that coupling ratio Cp is always not larger than 1, enhance when Cp becomes close to 1, difference between floating gate voltage Vfg and control gate voltage Vcg becomes smaller. Therefore, burden on the peripheral circuitry for generating control gate voltage Vcg can be reduced. As a result, the area for a high voltage generating circuit (a charge pump circuit) in the peripheral circuitry can be reduced and the chip area of the nonvolatile semiconductor memory device can be reduced.

In order to increase capacitance Ccf213 between control gate 209 and floating gate 203, the thickness of interpoly insulation film 203 may be reduced, the area of interpoly insulation film 208 in contact with control gate 209 and floating gate 203 may be increased, or permittivity of insulation film 208 may be increased. However, when the thickness of interpoly insulation film 208 is made thinner or a film having high permittivity is used other than silicon oxide film or silicon nitride film, retention failure is likely in which charges stored in floating gate 203 leak through interpoly insulation film 208 to control gate 209. Accordingly, generally, the area of interpoly insulation film 208 in contact with control gate 209 and floating gate 203 is increased. In order to increase the area of interpoly insulation film 208, not only the area of the upper surface of floating gate 203 but also areas on the side walls of floating gate 203 are utilized, so that the area of interpoly insulation film 208 in contact with control gate 209 and floating gate 203 is increased. For this reason, the upper surface of thick oxide film 206 is made lower by the thickness z than the upper surface of floating gate 203 so as to utilize the area of the side walls on both sides of the floating gate 203.

Referring to FIG. 30, when thick oxide film 206 is wet etched much by hydrofluoric acid solution and the side walls of floating gate 203 are exposed so as to increase the area of interpoly insulation 208 in contact with control gate 209 and floating gate 203, there arises the following problem. More specifically, it is likely that the thick oxide film 206 is etched too much by variations in process parameters such as variation in etching rate of hydrofluoric acid solution, variation of etching rate caused by film property, state of the thick oxide film 206 to be etched, and so on. As a result, the upper surface of thick oxide film 206 comes to be positioned lower than the bottom surface of floating gate 203. Eventually, the thick oxide film 206 comes to have such a shape as shown FIG. 30 forming a parasitic transistor 212. Parasitic transistor 212 is formed by control gate 209 serving as a gate electrode, interpoly insulation film 208 as a gate oxide film, the portion A in the figure serving as a channel region, and upper and lower portions on the sheet, not shown, serving as a pair of source/drain regions. The threshold voltage Vth of memory cell 210 as a single transistor is high. Further, in memory cell 210 as a single transistor, only a current not higher than the current value enabling determination of current flow in the channel of the memory cell flows. Even in such a case, a current not lower than the current value allowing determination of a current flow in the channel of the memory cell may flow in the parasitic transistor 212 when a certain voltage is applied to control gate 209. In such a case, the memory cell as a whole malfunctions.

The first problem of the second prior art example will be described in the following.

According to the second prior art example, referring to FIG. 22, silicon nitride film 211 is deposited on floating gate 203. Therefore, the problem experienced by the first prior art example, that is, plasma damage at the surface of floating gate and inner portion of floating gate near the surface can be solved. Further, physical and chemical damages at the upper surface of floating gate and inner portion of floating gate near the upper surface by the etching under CMP method can be avoided. Further, contamination by carbon or the like from the resist formed of an organic substance, can be avoided.

However, referring to FIGS. 26 and 27, when silicon nitride film 211 is removed by hot phosphoric acid, floating gate 203 is exposed to the hot phosphoric acid, so that the surface of the floating gate 203 is made rough and comes to have small recesses and protrusions. Roughness and small protrusions and recesses of the upper surface of the floating gate lead to electric field concentration, possibly causing unsatisfactory retention.

The second problem of the second prior art example is as follows.

More specifically, in the second prior art example, in order to increase coupling ratio Cp, that is, in order to increase capacitance Ccf between control gate 209 and floating gate 203, the upper surface of thick oxide film 206 is made lower by the thickness z than the upper surface of floating gate 203 so as to increase the area of interpoly insulation film 208 in contact with control gate 209 and floating gate 203 by twice the thickness z of the side walls (both sides) of the exposed floating gate 203.

In this manner, capacitance Ccf between control gate 209 and floating gate 203 is increased.

However, when thick oxide 206 protruding upper than the upper surface of floating gate 203 is etched too much by using hydrofluoric acid solution as shown in FIG. 27, the upper surface of thick oxide film 206 may possibly be lower than the bottom surface of floating gate 203. In that case, parasitic transistor 212 shown in FIG. 30 is formed and memory cell 212 as a whole does not function properly.

SUMMARY OF THE INVENTION

As described above, according to the nonvolatile semiconductor memory device and manufacturing method thereof in accordance with the first and second prior art techniques, dry etching, CMP method and dry etch back damage the surface of the floating gate and inner portion of the floating gate near the surface, eventually deteriorating quality of the interpoly insulation film possibly causing unsatisfactory retention of the nonvolatile semiconductor memory device.

Further, at removal of the silicon nitride film by hot phosphoric acid, the surface of the floating gate is, made rough and because of small protrusions and recesses at the surface, an electric field concentration occurs at a certain portion of the interpoly insulation film possibly causing unsatisfactory retention or the like.

In addition, contamination such as carbon coming out from the resist may adhere the exposed surface of the floating gate and enter the inner portion of the floating gate near the surface of the floating gate, deteriorating quality of the interpoly insulation film deposited on the surface of the floating gate, possibly causing unsatisfactory retention or the like. Further, the contamination may adhere on the side wall portions and bottom surface portions of a trench provided in the silicon semiconductor substrate, and may enter the inner portion of the silicon semiconductor substrate near the surface of the semiconductor substrate in the trench formed in the silicon semiconductor substrate, degrading capability of isolating memory cells (punch-through margin). Further, there is a disadvantage that by fluctuation or the like of process parameters in the manufacturing flow for improving coupling ratio (Cp), a parasitic transistor is formed, resulting in a memory cell which does not properly function as a whole.

Therefore, an object of the present invention is to provide a improved nonvolatile semiconductor memory device and manufacturing method thereof which can eliminate contamination by contaminants such as carbon coming out from the resist, which can improve quality of the interpoly insulting film, which suppresses unsatisfactory retention and which has sufficient isolating capability (punch-through margin) between memory cells.

Another object of the present invention is to provide an improved nonvolatile semiconductor memory device and manufacturing method thereof which provides an interpoly insulation film having higher quality and more stable than that of the prior art by eliminating damages to the surface of the floating gate and inner portion of the floating gate near the surface caused by dry etching of the floating gate or caused by removal of the thick oxide film by CMP method or dry etch back method, and by eliminating small protrusions and recesses of the surface of the floating gate caused by hot phosphoric acid, whereby preventing deterioration of the quality of the interpoly insulation film which is the cause of unsatisfactory retention or the like.

A still further object of the present invention is to provide an improved nonvolatile semiconductor memory device and manufacturing method thereof which can eliminate unstable manufacturing process through which a parasitic transistor causing disfunctional memory cell is formed, which can increase coupling ratio (Cp) and which can suppress fluctuation thereof.

In order to attain the above described objects, according to the present invention, a tunnel oxide film and a floating gate are deposited successively on the surface of the semiconductor substrate. An etching mask formed of an inorganic material, which does not contain an organic material as a main component, is formed on the floating gate with buffer layers interposed. Using the etching mask as a mask, the buffer layers, the floating gate, the tunnel oxide film and the semiconductor substrate are etched successively, and a trench is formed in the semiconductor substrate.

According to the present invention, a tunnel oxide film and a floating gate are deposited successively on a surface of a semiconductor substrate. In order to prevent damages from being left at the surface of the floating gate and inner portion of the floating gate near the surface, a thin oxide film and a semiconductor thin film as buffer layers, and an etching mask formed of an inorganic material not containing an organic material as a main component are deposited on the surface of the floating gate. By utilizing the buffer layers, a trench isolation structure is formed so as to prevent damages from being left at the surface of the floating gate and inner portion of the floating gate near the surface. Further, in such a way that damages is not left at the surface of the floating gate and the inner portion of the floating gate near the surface, the etching mask, the thin oxide film, and the semiconductor thin film are removed. Thereafter, on the surface of the floating gate, an interpoly insulation film and a control gate are formed and, eventually, a memory cell is formed.

Further, according to the present invention, a tunnel oxide film, a floating gate, a thin oxide film and a semiconductor thin film are successively deposited on a surface of a semiconductor substrate. On the surface of the semiconductor thin film, an etching mask formed of an inorganic material not containing an organic material as a main component and having a prescribed width is formed at a prescribed space, along a certain direction X. Using the etching mask, the semiconductor thin film, the thin oxide film, the floating gate, the tunnel oxide film and the semiconductor substrate are etched in self aligned manner with respect to the etching mask, whereby a trench self aligned with respect to the etching mask is formed in the semiconductor substrate. Consequently, a trench is formed which includes one trench and two stacked structures formed in self alignment on both sides of the trench, which structure including the etching mask, the semiconductor thin film, the thin oxide film, the floating gate and the tunnel oxide film. A thick oxide film is deposited in the trench as well as on the upper surfaces and side surfaces of the stacked structures until it is sufficiently filled in the trench.

The thick oxide film is removed together with the etching mask until the etching mask at the uppermost portion of the stacked structure is sufficiently exposed, so that the thick oxide film is filled only in the trench.

The etching mask with its surface exposed, which is not necessary for the function of the nonvolatile memory cell is removed, using the semiconductor thin film below the etching mask as a stopper film. Here, if the semiconductor thin film as a stopper film is not left at the time point when the etching mask is removed, the thin oxide film below the semiconductor thin film would also be etched, causing damage to the floating gate. In order to prevent this problem, etching mask is removed such that the semiconductor thin film is left even after the etching mask is removed.

The etching mask is removed and consequently the thick oxide film protrudes. By etching the protruding thick oxide film by an etching method in which the ratio A between the etching rate of the thick oxide film and the etching rate of the semiconductor thin film (for easier and understanding, A=etching rate of the thick oxide film÷etching rate of the semiconductor thin film) is high, the position of the upper surface of the thick oxide film is made lower than the upper surface of the floating gate and higher than the bottom surface of the floating gate. At the end of etching, if the semiconductor thin film not necessary for the function of the nonvolatile memory cell itself is removed besides the thick oxide film, then the thin oxide film below the semiconductor thin film would also be etched, causing damages to the floating gate.

In order to prevent this problem, the thick oxide film is etched by the etching method in which damage is not caused and the ratio A of the etching rate of the thick oxide film with respect to the etching rate of the semiconductor thin film is high, so that at the end of etching of the thick oxide film, the semiconductor thin film is left and the side wall surfaces of the floating gate and inner portions of the floating gate near the side wall surfaces, which side wall portions are exposed during etching of the thick oxide film, are not damaged.

The semiconductor thin film of which surface is exposed, not necessary for the function itself of the nonvolatile memory cell is removed by an etching method in which ratio B between the etching rate of the semiconductor thin film and the etching rate of the oxide film (for easier understanding, B=etching rate of the semiconductor thin film÷etching rate of the thin oxide film, or B=etching rate of the semiconductor thin film÷etching rate of the thick oxide film) is high. Here, if the thin oxide film below the semiconductor thin film which is being etched is removed and is not left at the end of etching for removing the semiconductor thin film during over etching period (which will be described later) for etching the semiconductor thin film, the floating gate would be etched and, eventually, the floating gate would be damaged. In order to prevent this problem, the semiconductor thin film is removed under such etching condition that the thin oxide film is left at the end of etching for removing the semiconductor thin film and that the height of the upper surface of the thick oxide film having its surface exposed during removal of the semiconductor thin film is not lower than the bottom surface of the floating gate at the end of etching for removing the semiconductor thin film, that is, the semiconductor thin film is removed by an etching method in which the ratio B of the etching rate of the semiconductor thin film with respect to the etching rate of the oxide film is high.

The aforementioned over etching refers to etching for longer time period than necessary for completely etching away the film to be etched. The term "over etching period" here refers to the time period from the point when the film to be etched is completely removed by etching until the end of the etching time set longer.

When the thin oxide film is removed, the thin oxide film is removed by such an etching method in that the position of the upper surface of the thick oxide film of which surface is exposed is not lower than the position of the bottom surface of the floating gate and that at the end of removal of the thin oxide film, damages are not left at the surface of the floating gate which surface is exposed, or at inner portions of the floating gate near the surface.

Thereafter, an interpoly insulation film and a control gate are formed successively on the surface of the floating gate.

The control gate is etched using the interpoly insulation film as a stopper film by a desired width of removal and desired width to be left, along a direction Y which is orthogonal to the direction X.

The interpoly insulation film, which is exposed where the control gate has been etched by the desired width of removal, and the floating gate are etched.

In this manner, the nonvolatile semiconductor memory device is completed.

Functions and effects of the present invention are as follows. Since etching of the floating gate and etching for forming the trench in the semiconductor substrate are performed using an etching mask formed of an inorganic material not containing an organic material as a main component, contaminants such as carbon from the resist containing organic material as a main component is not generated. Therefore, the side wall surfaces of the floating gate, the inner portions of the floating gate near the side wall surfaces, the side wall surfaces of the trench formed in the semiconductor substrate and inner portions of the semiconductor substrate near the side wall surface, the bottom surface of the trench formed in the semiconductor and inner portions of the semiconductor substrate near the bottom surface are not damaged or contaminated by the contaminants mentioned above. Therefore, high quality of interpoly insulation film formed on the side wall surfaces of the floating gate is ensured. As a result, cause of unsatisfactory retention can be eliminated. Further, in forming trench isolation provided at the trench portion in the semiconductor substrate, defects caused by impurities can be prevented, junction breakdown voltage is not degraded, and leak current path is not formed. As a result, trench isolation having high isolating capability (punch-through margin) between adjacent memory cells can be provided.

Further, on the surface of the floating gate, a thin oxide film and a semiconductor thin film as buffer layers and an etching mask formed of an inorganic material are formed. Before depositing interpoly insulation film on the surface and on the side wall surfaces of the floating gate, the buffer layers must be removed. However, utilizing the buffer layers, trench isolation is formed without damaging the surface of the floating gate and inner portions of the floating gate near the surface. Then, the unnecessary etching mask, the semiconductor thin film and the thin oxide film are removed such that the surface of the floating gate and inner portions of the floating gate near the surface are not damaged. Accordingly, the damage at the surface of the floating gate and inner portions of the floating gate near the surface experienced in the conventional dry etching, CMP method or dry etch back method are not experienced in the present invention.

In the prior art, the floating gate surface is affected by hot phosphoric acid, resulting in small protrusions and recesses at the surface of the floating gate. However, such problem can be avoided in the present invention. Therefore, an interpoly insulation film which is stable and has high quality is formed, and since one cause of unsatisfactory retention can be eliminated.

Further, according to the present invention, the position of the upper surface of the thick oxide film is not made low at one time by wet etching using hydrofluoric acid solution of which process parameter fluctuates considerably. First, a stacked structure of a floating gate, a thin oxide film, a semiconductor thin film and an etching mask formed of an inorganic material is prepared. Thereafter, before forming an interpoly insulation film in order to expose the surface and side wall surfaces of the floating gate, the etching mask formed of the inorganic material is removed, the semiconductor thin film is removed and the thin oxide film is removed successively, by a stable method with small fluctuation of process parameters. According to this method, the position of the upper surface of the thick oxide film can be made lower than the position of the upper surface of the floating gate and higher than the position of the bottom surface of the floating gate. Therefore, by the area of the exposed side walls of the floating gate, the area of the interpoly insulation film between the control gate and the floating gate can be enlarged. Accordingly, the capacitance Ccf between the control gate and the floating gate is increased, and as a result, coupling ratio Cp (Cp=Ccf÷(Ccf+Cfs)) can also be increased. Further, since a parasitic transistor is not formed, a memory cell which may cause malfunction is not formed. Therefore, proper function of the memory cell is ensured.

Further, since the side walls of the floating gate are exposed by a stable method having small fluctuation of process parameters, fluctuation of capacitance Ccf between the control gate and the floating gate as well as fluctuation of coupling ratio Cp can be suppressed.

The present invention will be summarized in the following.

An object of the present invention is to provide a nonvolatile semiconductor memory device with a trench isolation, improved to eliminate contamination by carbon or the like coming out from the resist.

Another object of the present invention is to provide a nonvolatile semiconductor memory device with trench isolation improved to suppress retention failure by improving film quality of interpoly insulation film.

Another object of the present invention is to provide a nonvolatile semiconductor memory device with trench isolation having sufficient capability of isolation between memory cells.

A still further object of the present invention is to provide a nonvolatile semiconductor memory device with trench isolation improved to eliminate damage at the surface of the floating gate and the inner portion of the floating gate near the surface.

Still further object of the present invention is to provide a nonvolatile semiconductor memory device with trench isolation improved to prevent generation of small recesses and protrusions at the surface of the floating gate.

A still further object of the present invention is to provide a nonvolatile semiconductor memory device with trench isolation improved not to form a parasitic transistor.

A still further object of the present invention is to provide a nonvolatile semiconductor memory device with trench isolation improved to increase coupling ratio and to suppress variation thereof.

A still further object of the present invention is to provide a method of manufacturing a nonvolatile semiconductor memory device with trench isolation having the above described features.

According to a first aspect, the nonvolatile semiconductor memory device includes a semiconductor substrate. Trenches for trench isolation are formed as lines at the main surface of the semiconductor substrate. A first insulating film is provided on the semiconductor substrate to fill the trench. On the semiconductor substrate on both sides of the trench, a first gate electrode is provided with a first oxide film interposed. A second gate electrode is formed on the first gate electrode with a second insulating film interposed. An angle formed by a side wall of the trench and an upper surface of the semiconductor substrate is smaller than 90°.

According to a second aspect, in the nonvolatile semiconductor memory device, the first oxide film is formed of a material containing an oxide of the same element as the main element constituting the semiconductor substrate.

According to a third aspect, in the nonvolatile semiconductor memory device, the first oxide film is formed of $SiO_2$ or of a material containing $SiO_2$.

According to a fourth aspect, in the nonvolatile semiconductor memory device, the first oxide film is formed of $SiO_xN_y$ or of a material containing $SiO_xN_y$.

According to a fifth aspect, in the nonvolatile semiconductor memory device, the second insulating film is formed of a material containing an oxide of the same element as the main element constituting the semiconductor substrate, a material containing a nitride of the same element as the main element constituting the semiconductor substrate, or stacked film of a material containing an oxide of the same element as the main element constituting the semiconductor substrate and a material containing a nitride of the same element as the main element constituting the semiconductor substrate.

According to a sixth aspect, in the nonvolatile semiconductor memory device, the second insulating film is formed of a material containing $SiO_2$, a material containing $Si_xN_y$, or a stacked film of a material containing $SiO_2$ and a material containing $Si_xN_y$.

According to a seventh aspect, in the nonvolatile semiconductor memory device, the first insulating film does not contain any impurity providing conductivity to the semiconductor substrate.

According to an eighth aspect, in the nonvolatile semiconductor memory device, a portion where the first insulating film is in contact with the side wall of the first gate electrode is positioned below the upper surface of the first gate electrode and positioned higher than the lower surface of the first gate electrode.

According to a ninth aspect, the method of manufacturing a nonvolatile semiconductor memory device relates to a method of manufacturing a nonvolatile semiconductor memory device having trench isolation formed as lines. First, on a semiconductor substrate, a first oxide film, a first gate electrode, a thin oxide film and a semiconductor thin film are deposited successively (first step). On the semiconductor thin film, an etching mask of an inorganic substance not containing any organic substance is formed to cover portions other than those portions where the trench is to be formed (second step). Using the etching mask, semiconductor thin film, the thin oxide film, the first gate electrode, the first oxide film and the surface of the semiconductor substrate are etched in self aligned manner, and trenches as lines are formed at the main surface of the semiconductor substrate (third step). A first insulating film is deposited on the semiconductor substrate to fill the trenches and to cover the etching mask (fourth step). The surface of the first insulating film is removed so that the surface of the first insulating film is made flush with the surface of the etching mask (fifth step). The etching mask is removed so that the surface of the semiconductor thin film is exposed and head portion of the first insulating film is protruded (sixth step). The head portion of the first insulating film is removed by etching until a portion where the first insulating film is in contact with the side wall of the first gate electrode is positioned between the upper and lower surfaces of the first gate electrode (seventh step). The exposed semiconductor thin film is removed by etching and the surface of thin oxide film is exposed (eighth step). The exposed thin oxide film is removed so that the surface of the first gate electrode is exposed (ninth step). The second insulating film is deposited on the semiconductor substrate to cover the first gate electrode, and thereafter, the second gate electrode is deposited (tenth step). The second gate electrode is patterned, using the second insulating film as a stopper film (eleventh step). By using patterned second gate electrode, the second insulating film and the first gate electrode at an exposed region are removed by etching (twelfth step).

According to a tenth aspect, in the method of manufacturing a nonvolatile semiconductor memory device, the etching in the seventh step is performed under the condition that etching ratio of the etching rate of the first insulating film and etching rate of the semiconductor thin film (etching rate of the first insulating film÷etching rate of the semiconductor thin film) is at least 5.

According to an eleventh aspect, in the method of manufacturing a nonvolatile semiconductor memory device, the etching in the eighth step is performed under the condition that the etching ratio of etching rate of the semiconductor thin film and etching rate of the thin oxide film (etching rate of the semiconductor thin film÷etching rate of the thin oxide film) is at least 5.

According to a twelfth aspect, in the method of manufacturing a nonvolatile semiconductor memory device, the semiconductor thin film is formed of a non-doped polycrystalline silicon.

According to a thirteenth aspect, in the method of manufacturing a nonvolatile semiconductor memory device, in the fifth step, the surface of the first insulating film is removed by dry etch back method or CMP (Chemical Mechanical Polishing) method.

According to a fourteenth aspect, in the method of manufacturing a nonvolatile semiconductor memory device, as the inorganic substance as the material of the etching mask, a material of which etching rate under the CMP method is slower than the etching rate of an oxide film under the CMP method is used.

According to a fifteenth aspect, in the method of manufacturing a nonvolatile semiconductor memory device, as the inorganic substance as the material of the etching mask, a nitride of the same element as the main element constituting the semiconductor substrate is used.

According to a sixteenth aspect, in the method of manufacturing a nonvolatile semiconductor memory device, $Si_xN_y$ is used as the inorganic substance as the material of the etching mask.

According to a seventeenth aspect, in the method of manufacturing a nonvolatile semiconductor memory device, deposition of the first insulating film in the fourth step is performed by LPCVD or HDP method.

According to an eighteenth aspect, in the method of manufacturing a nonvolatile semiconductor memory device, the etching in the seventh step is performed such that a portion where the first insulating film is in contact with the side wall of the first gate electrode is positioned midway between the upper and bottom surfaces of the first gate electrode.

According to a nineteenth aspect, in the method of manufacturing a nonvolatile semiconductor memory device, etching of the semiconductor thin film, thin oxide film, the first gate electrode and the first oxide film in the third step is performed vertical to the semiconductor substrate. Etching of the surface of the semiconductor substrate is performed such that an angle formed by the side wall surface of the trench and upper surface of the semiconductor substrate is smaller than 90°.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

First Embodiment

A method of manufacturing a nonvolatile semiconductor memory device in accordance with a first embodiment will be described with reference to the figures.

Figure 1:
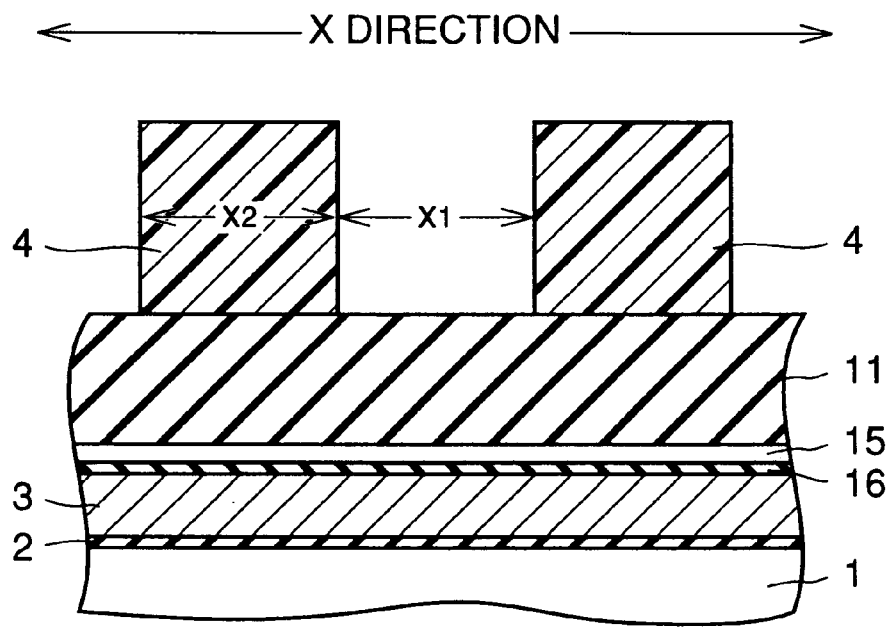
FIGS. 1 to 10 are cross sections showing the semiconductor device in the first to tenth steps of a method of manufacturing a nonvolatile semiconductor memory device in accordance with a first embodiment of the present invention.

Referring to FIG. 1, on a surface of a silicon semiconductor substrate 1, a tunnel oxide film 2 of silicon oxide is formed. On tunnel oxide film 2, a floating gate 3 formed of polycrystalline silicon containing an impurity such as phosphorus is deposited. Thereafter, a thin oxide film 16 formed of an oxide of silicon element, and a thin polycrystalline silicon film 15 formed of polycrystalline silicon not containing any impurity are formed. Thereafter, a silicon nitride film 11 which subsequently serves as a hard mask and stopper film in the CMP method, formed of $Si_xN_y$, is deposited. Silicon nitride film 11 can serve as a stopper film, since its etching rate is slower than the etching rate of oxide film in the CMP method. Thereafter, by photolithography, a resist pattern 4 having a good shape with a desired width $X_1$ for removal and $X_2$ to be left along the direction X is formed on silicon nitride film 11.

Figure 2:
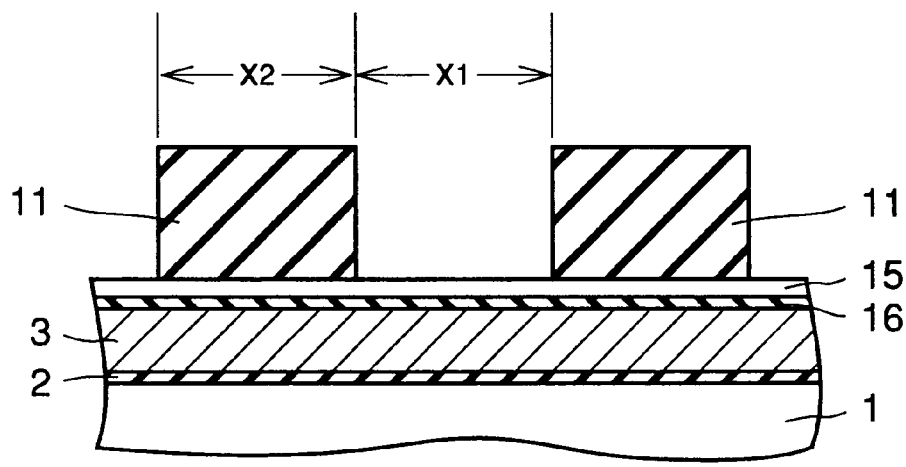

Referring to FIGS. 1 and 2, using resist pattern 4 as an etching mask, silicon nitride film 11 is dry etched, and a silicon nitride film 11 having a good shape with desired width $X_1$ for removal and desired width $X_2$ to be left along the direction X is formed.

Figure 3:
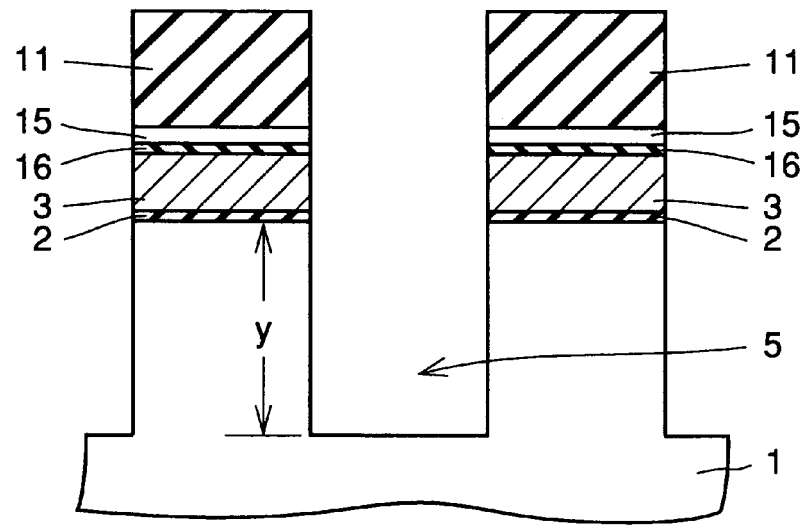

Referring to FIG. 3, using silicon nitride film 11 as a hard mask, thin polycrystalline silicon film 15, thin oxide film 16, floating gate 3, tunnel oxide film 2 and silicon semiconductor substrate 1 are etched in self aligned manner with respect to silicon nitride film 11 by unisotropic dry etching suitable for etching polycrystalline silicon and silicon single crystal. Thus a trench having a desired depth y is formed in silicon semiconductor substrate 1, and two stacks of silicon nitride film 11, thin polycrystalline silicon film 15, thin oxide film 16, floating gate 3 and tunnel oxide film 2 are formed on both sides of the trench.

At this time, thin polycrystalline silicon film 15, thin oxide film 16, floating gate 3, tunnel oxide film 2 and silicon semiconductor substrate 1 are etched using the hard mask formed of an inorganic substance not containing any organic substance as an etching mask, the inside of trench 5 and side walls of floating gate 3 are not contaminated by the organic substance such as carbon.

Referring to FIG. 3, silicon nitride film 11 which is a hard mask formed of an inorganic substance is made thin to some extent. The reason for this is as follows. Etching rate in anisotropic etching of tunnel oxide film 2 formed of an oxide of silicon element and thin oxide film 16 formed of an oxide of silicon element is not much different from the etching rate in anisotropic dry etching of $Si_xN_y$ which is the material of the hard mask, or, it is difficult to find etching condition which can enlarge the difference. Therefore, when tunnel oxide film 2 and thin oxide film 16 are etched, silicon nitride film 11 is also etched to some extent.

Figure 4:
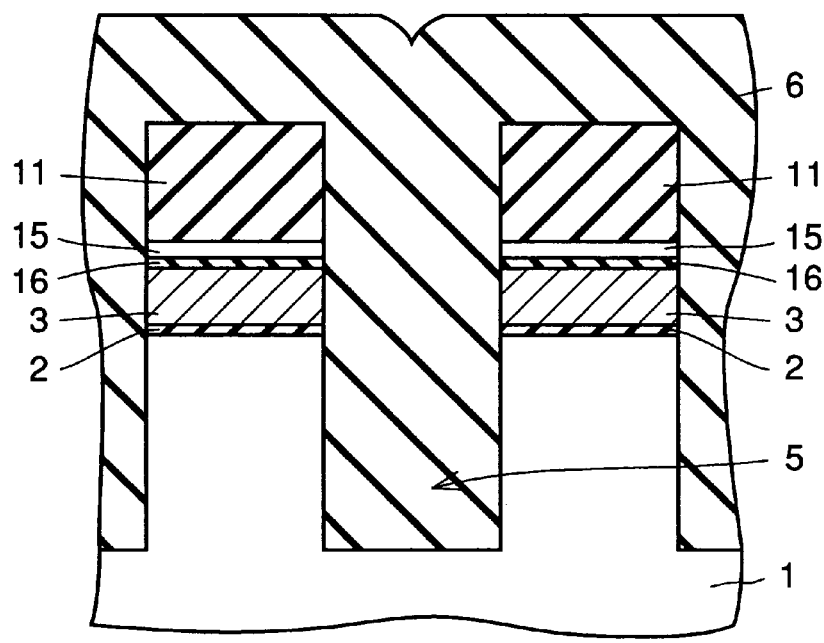

Referring to FIG. 4, thick oxide film 6 is deposited on silicon semiconductor substrate 1 so as to sufficiently fill trench 5.

Figure 5:
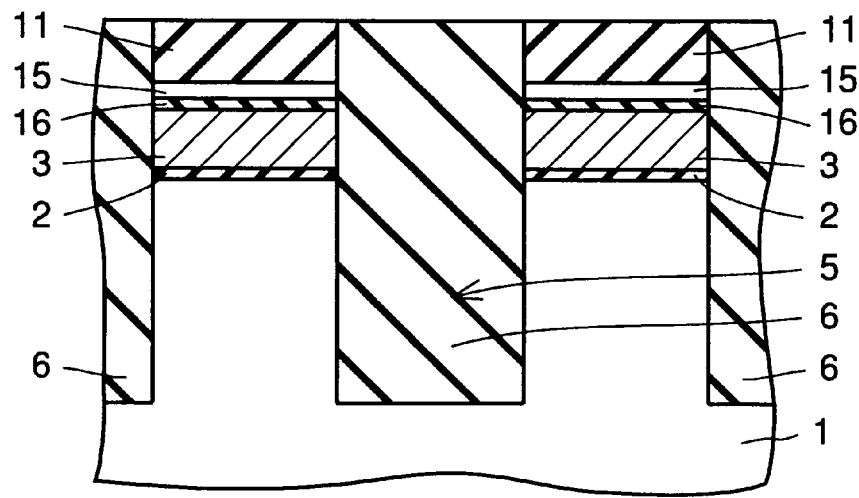

Referring to FIGS. 4 and 5, using silicon nitride film 11 as a stopper film in the CMP method, thick oxide film 6 is removed until the upper surface of thick oxide film 6 is made flush with the upper surface of silicon nitride film 11, thus filling trench 5 with thick oxide film 6. Though thick oxide film 6 is removed by CMP method in the example of FIG. 5, it may be removed by dry etch back.

At this time, silicon nitride film 11 functions as a stopper film of the CMP method. Since floating gate 3 is positioned below silicon nitride film 11, floating gate 3 is not removed by the CMP method. Further, floating gate 3 is not made thinner. The floating gate 3 is neither damaged by physical etching nor chemically damaged by alkali solution. Such advantages can similarly be obtained even when thick oxide film is removed by dry etch back method. More specifically, even when dry etch back method is used, floating gate 3 is not damaged by plasma during etching in the dry etch back method.

Referring to FIG. 5, silicon nitride film 11 is shown considerably thinner than the silicon nitride film 11 shown in FIG. 4. This means that silicon nitride film 11 is etched considerably by the CMP method so as to sufficiently remove thick oxide film 6 by the CMP method.

Figure 6:
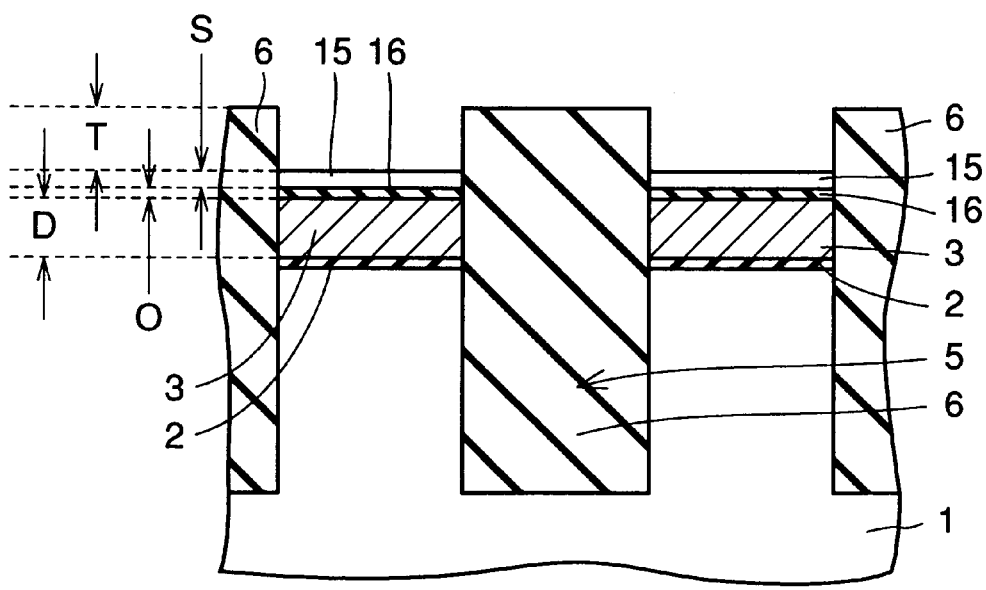

Referring to FIGS. 5 and 6, the unnecessary silicon nitride film 11 is removed. At this time, immediately below silicon nitride film 11, there is thin polycrystalline silicon film 15 formed of polycrystalline silicon not containing any impurity. Accordingly, even when hot phosphoric acid is used to remove silicon nitride film 11, only the surface of thin polycrystalline silicon film 15 is made rough and comes to have small recesses and protrusions, and the surface of the floating gate 3 is not made rough. The floating gate 3 does not have small recesses and protrusions at its surface.

Even when it is accidentally dipped in hot phosphoric acid for a longer time period, etching rate of the thin polycrystalline silicon film 15 formed of polycrystalline silicon not containing any impurity with hot phosphoric acid is smaller than that of polycrystalline silicon containing impurity. Therefore, thin polycrystalline silicon film 15 is not completely removed.

Figure 7:
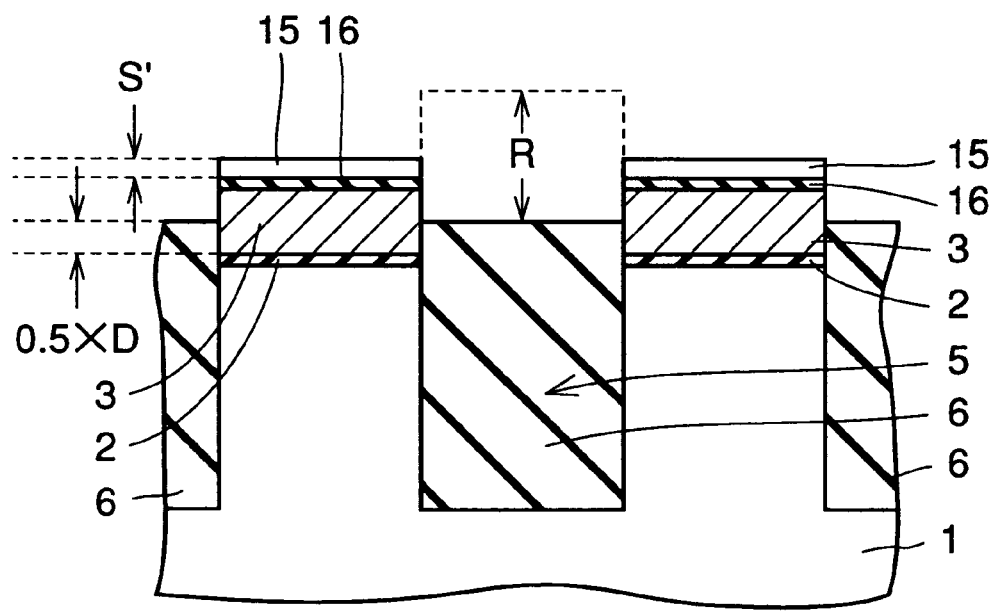

If thin polycrystalline silicon film 15 is completely removed, thin oxide film 16 would be completely removed during etching of the thick oxide film 6 which takes place in the next step shown in FIG. 7. As a result, the surface of floating gate 3 is attacked by etching plasma during etching of the thick oxide film 6, leaving damages at the surface of floating gate 103 and inner portion of floating gate 103 near the surface. In order to avoid such a problem, thin polycrystalline silicon film 15 formed of polycrystalline silicon not containing impurity having small etching rate with hot phosphoric acid is provided on thin oxide film 16.

Instead of removal of the silicon oxide film 11 using hot phosphoric acid, dry etching for which etching rate of silicon nitride film 11 is fast and etching rate of thin polycrystalline silicon film 15 is slow may be used. To describe in greater detail, such a dry etching method in that the etching ratio between etching rate of silicon nitride film 11 and etching rate of thin polycrystalline film 15 is large enough so that even when silicon nitride film 11 is etched to be completely removed, the thin polycrystalline film 15 below silicon nitride film 11 is left is preferably used. When silicon nitride film 11 is removed by such dry etching method, only the surface of thin polycrystalline film 15 is made rough, and the surface of floating gate 3 is not made rough. Floating gate 3 does not have any small recesses and protrusions at its surface. Further, the thin polycrystalline silicon film 15 is not completely removed. Therefore, when the thick oxide film 6 is etched by dry etching in the subsequent step shown in FIG. 7, the surface of floating gate 3 is not attacked by dry etching. Further, floating gate 3 is not damaged at its surface and inner portion of floating gate 3 near the surface.

Here, thickness and the like of respective films will be defined in the following manner.

D: thickness of floating gate 3

O: thickness of thin oxide film 16 shown in FIG. 6

S: thickness of thin polycrystalline silicon film 15 shown in FIG. 6.

T: distance between the position of the upper surface of silicon nitride film 11 shown in FIG. 5 and position of the upper surface of thin polycrystalline silicon film 15 in FIG. 6.

Referring to FIG. 7, in order to expose side wall portions of floating gate 3, thick oxide film 6 is etched by low damage dry etching method, such that the upper surface of thick oxide film 6 is positioned at an intermediate portion between the upper and the lower surfaces of floating gate 3. In other words, thick oxide film 6 is removed such that the height of the upper surface of thick oxide film 6 from the bottom surface of floating gate is 0.5×D. Low damage dry etching is used here from the following reason. When the thick oxide film 6 is etched, the side walls of the floating gate 3 are exposed inevitably. Therefore, plasma damage to the side walls of the floating gate 3 should be minimized at the time of dry etching of the thick oxide film 6. At this time, thin polycrystalline silicon film 15 which has been exposed prior to etching is made thin because it is etched by the dry etching method.

Here, the ratio (generally referred to as etching ratio) A between the etching rate of thick oxide film 6 and etching rate of thin polycrystalline silicon film 15 under the low damage dry etching method is represented by the following expression.

A=etching rate of thick oxide film 6 under oxide film dry etching÷etching rate of thin polycrystalline silicon film 15 at the time of oxide film dry etching.

The distance R between the position of the upper surface of thick oxide film 6 before oxide film dry etching (shown in FIG. 6) and the position of the upper surface of thick oxide film 6 etched to the position in the middle of the upper and lower surfaces of floating gate 3 (shown in FIG. 7) is represented by the following expression:

R=T+S+O+(D−0.5×D)

=T+S+O+0.5×D (as for reference characters T, S, O and D in the expression, refer to the definitions above)

Therefore, the thickness S' of the thin polycrystalline silicon film 15 which is etched and made thin by oxide film dry etching is represented by the following expression:

S'=S−R÷A (in the expression, meanings of R and A are as described above).

What is important in the step of manufacturing shown in FIG. 7 is to avoid elimination of thin polycrystalline silicon film 15 (shown in FIG. 6) by etching during the oxide film dry etching. When the thick oxide film 6 is being etched by the distance R during oxide film dry etching and thin polycrystalline silicon film 15 is eliminated, then the underlying thin oxide film 16 will be etched. In that case, the upper surface of floating gate 3 is attacked by the oxide dry etching, and the upper surface of floating gate 3 and the inner portion of floating gate 3 near the upper surface may possibly be damaged. In order to prevent this problem, thin polycrystalline silicon film 15 (having the thickness of S') must be left even when the thickness is reduced. Therefore, film thicknesses, distance and etching ratio A must be determined to satisfy the following condition.

$$S'=S-R\div A$$

$$S-(T+S+\overline{O}+0.5\times D))\div A>0(\text{zero}) \qquad (1)$$

In other words, the present embodiment is directed to a nonvolatile semiconductor memory device having the structure satisfying the expression (1) or manufactured through the steps satisfying the expression (1).

Figure 8:
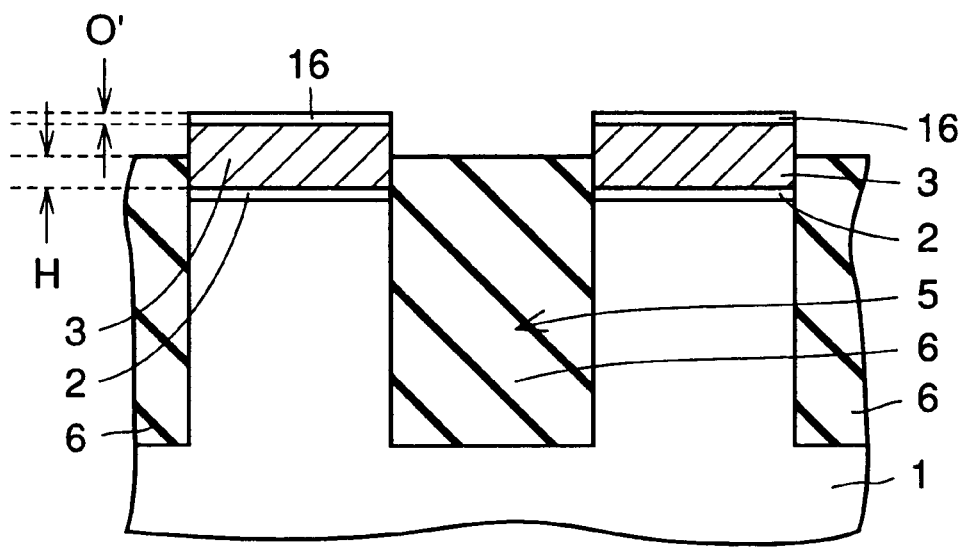

Referring to FIGS. 7 and 8, in order to remove unnecessary thin polycrystalline silicon film 15, silicon dry etching method is used, so that the unnecessary thin polycrystalline silicon film 15 is removed by etching. At this time, if thin polycrystalline silicon film 15 should remain, the remaining thin polycrystalline silicon film 15 will serve as a mask in etching the thin oxide film 16 of the next step, preventing complete etching removal of thin oxide film 16. Then, the stack of thin polycrystalline silicon film 15 and thin oxide film 16 which was not removed but left on floating gate 3 affects interpoly insulation film 8 when interpoly insulation film 8 is deposited in the second next step, possibly causing retention failure. Therefore, when the unnecessary thin polycrystalline silicon film 15 is to be completely removed by silicon dry etching, etching is performed for twice the thickness of the thin polycrystalline silicon film 15.

However, when the thin oxide film 16 which is an underlayer when the thin polycrystalline silicon film 15 is removed is eliminated during etching of thin polycrystalline silicon film 15, then floating gate 3 would be undesirably etched, since etching is performed by silicon dry etching method. This leads to damages at the upper surface of floating gate 3 and inner portion of floating gate 3 near the upper surface and at the side wall surfaces of floating gate 3 and inner portion of floating gate 3 near the side wall surfaces.

The ratio B between the etching rate of thin polycrystalline silicon film 15 and etching rate of thin oxide film 16 or thick oxide film 6 in silicon dry etching method is represented by the following expression.

B=Etching rate of thin polycrystalline silicon film 15 at the time of silicon dry etching÷etching rate of thin oxide film 16 or thick oxide film 6 at the time of silicon dry etching.

Further, when silicon dry etching is to be performed for twice the thickness (S') of thin polycrystalline silicon film 15, etching of thin oxide film 16 by silicon dry etching starts when the thin polycrystalline silicon film 15 having the thickness S' is removed completely by silicon dry etching. At the end of silicon dry etching for twice the thickness S' of thin polycrystalline silicon film 15, silicon dry etching of thin oxide film 16 is also completed. The thickness O' of thin oxide film 16 is represented by the following expression.

$$O'=O-S\div B$$
$$=O-(S-(R\div A))\div B$$
$$=O-(S\times A-R)\div(A\times B)$$

By the above described reason, thin oxide film 16 (thickness: O') should not be removed at this silicon dry etching. Therefore, film thicknesses, distances and etching ratios A and B must be determined to satisfy the following condition.

$$O'=O-(S\times A-R)\div(A\div B)$$
$$=O-(S\times A-(T+S+O+0.5\times D))\div(A\times B)>O(\text{zero}) \qquad (2)$$

In other words, the present embodiment is directed to a nonvolatile semiconductor memory device having such a structure that satisfies the expression (2) or manufactured by a method satisfying the expression (2).

During silicon dry etching, thick oxide film 6 is also etched. However, it is etched only during a time period from the start to the end of the silicon dry etching. Therefore, the height (H) of the upper surface of thick oxide film 6 from the bottom surface of floating gate 3 is represented by the following expression.

$$H=0.5\times D-2S'\div B$$
$$=0.5\times D-2X(S\times A-R)\div(A\times B)$$

Figure 9:
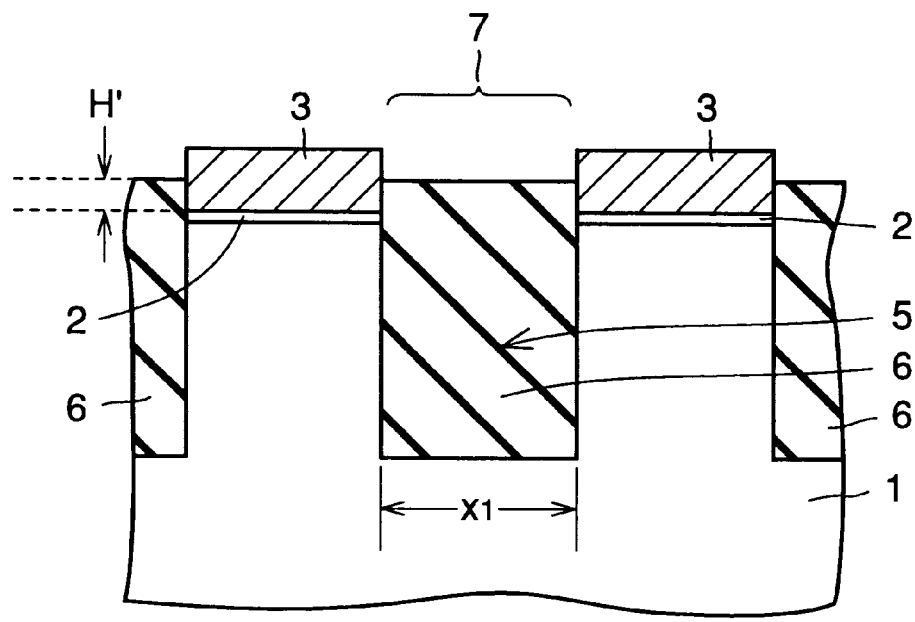
Figure 10:
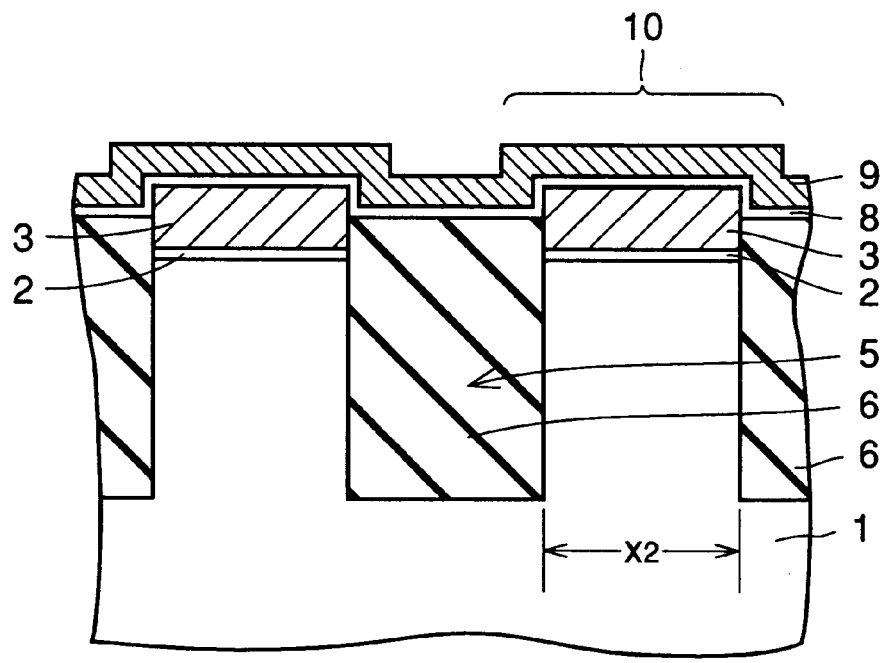

Thereafter, referring to FIG. 9, thin oxide film 16 is removed by wet etching using hydrofluoric acid solution. At this time, when thin oxide film 16 can not be removed completely but left to some extent, the thickness of interpoly insulation film on the surface of floating gate 3 becomes thick when interpoly insulation film 8 is deposited in the next step (FIG. 10). This leads to reduction in capacitance Ccf between the floating gate 3 and the control gate 9, reducing coupling ratio Cp. Therefore, thin oxide film 16 should be completely removed. For this purpose, wet etching is performed for twice the thickness (O') of thin oxide film 16 by hydrofluoric acid solution. When wet etching by hydrofluoric acid solution is performed, the underlayer of thin oxide film 16 is the floating gate 3. However, the damage of hydrofluoric acid solution on floating gate 3 need not be considered. In producing semiconductor memory devices, it is common to clean the surface of the polycrystalline silicon by hydrofluoric acid solution when the underlayer is polycrystalline silicon and an insulation film or the like is to be deposited thereon, as is widely known. Here, when the amount of wet etching by hydrofluoric acid solution is twice the thickness (O') of the thin oxide film 16, the position of the upper surface of thick oxide film 6 (shown in FIG. 8) will be lower than the bottom surface of floating gate 3, and therefore a parasitic transistor, which has been described in the prior art example, is formed. Therefore, memory cells which do not function properly as a whole are formed. Therefore, it should be considered how the position of the upper surface of thick oxide film 6 becomes lower by what amount of wet etching. For example, the height (H') of the surface of thick oxide film 6 from the bottom surface of floating gate 3 after the thin oxide film 16 is wet etched by twice the thickness (O') of thin oxide film 16 using hydrofluoric acid is represented by the following expression.

$$H'=H\times 2\times O'$$
$$=(0.5\times D-2\times(S\times A-R)\div(A\times B))-2\times(O-(S\times A-R)\div(A\times B))$$
$$=0.5\times D-2\times O$$

Let us estimate how the height (H') of the upper surface of thick oxide film 6 from the bottom of floating gate 3 varies by substituting specific values for the film thicknesses, etching ratio and so on, when the values have variation of ±10%. As for the specific values, appropriate film thicknesses and etching ratios are selected which satisfy the conditions of expressions (1) and (2) even when these values vary by ±10%. The specific values are as follows.

D=250 nm±10%: thickness of floating gate 3

O=10 nm±10%: thickness of thin oxide film 16 of FIG. 6

S=50 nm±10%: thickness of thin polycrystalline silicon film 15 of FIG. 6

T=100 nm±10%: distance between the position of upper surface of silicon nitride film 11 shown in FIG. 5 and position of upper surface of thin polycrystalline silicon film 15 shown in FIG. 6

A=30±10%: etching ratio of oxide film dry etching shown in FIG. 7

B=30±10%: etching ratio of silicon dry etching shown in FIG. 8

The height (H') of the upper surface of thick oxide film 6 from the bottom surface of floating gate 3 estimated under the above described condition is as follows.

Minimum value of H'=90.5 nm (when D=225 nm, O=11 nm)

Central value of H'=105.0 nm (when D=250 nm, O=10 nm)

Maximum value of H'=119.5 nm (when D=175 nm, O=9 nm)

Even the minimum value of H' is 90.5 nm. Therefore, the parasitic transistor formed in memory cell shown in FIG. 10 of the next step is, even when the film thicknesses and etching ratios may vary by ±10%, may be considered a transistor of which gate oxide film has the thickness of 90.5 nm. Therefore, it is considered that the parasitic transistor does not practically operate. Therefore, memory cell 10 shown in FIG. 10 as a whole functions properly.

Finally referring to FIG. 10, interpoly insulation film 8 and control gate 9 are deposited successively, and control gate 9 is etched with desired width for removal and desired width to be left in the direction Y orthogonal to the direction X, using interpoly insulation film 8 therebelow as a stopper film. Thereafter, interpoly insulation film 8 and floating gate 3 exposed at portions where control gate 9 have been etched are etched so as to eliminate electrical conduction between the floating gate 3 of the memory cell in the depth direction of the figure and the adjacent floating gate 3. Thus a semiconductor device in which each memory cell 10 functions properly is obtained.

For one memory cell 10, the length (L) of a portion exposed at the side wall of floating gate 3 which contributes to increase in capacitance Ccf between control gate 9 and floating gate 3 at the time of deposition of interpoly insulation film 8 is represented by the following expression.

$$L = 2 \times (D - H')$$
$$= 2 \times (D - (0.5 \times D - 2 \times O))$$
$$= 2 \times (0.5 \times D + 2 \times O)$$
$$= D + 4 \times O \quad (3)$$

In the above expression, the numeral 2 represents that there are two exposed side walls on both sides of one memory cell.

Let us estimate how much the value L varies when the thicknesses of films and the width ($X_2$) of the floating gate vary by ±10%. In other words, let us consider how the capacitance Ccf between control gate 9 and floating gate 3 vary when the film thicknesses and the width ($X_2$) of floating gate 3 of memory cell 10 vary by ±10%. Variation of the maximum and minimum values of capacitance Ccf between control gate 9 and floating gate 3 with respect to the central value is calculated. Here, it is assumed that film thickness and permittivity of interpoly insulation film 8 and the other length determining the area of interpoly insulation film 8 between control gate 9 and floating gate 3, that is, the length in the channel direction of control gate 9 are constant. The values of film thickness and the like are determined to be the following appropriate values.

$X_2$=500 nm±10%: width of the floating gate of memory cell 10 in FIG. 10.

D=250 nm±10%: thickness of floating gate 3

O=10 nm±10%: thickness of thin oxide film 16 of FIG. 6

The result of calculation was as follows.

Ccfmax=1.1×Ccfcenter

Ccfmin=0.9×Ccfcenter

In the above expressions, Ccfmax represents the maximum value of Ccf, Ccfcenter represents the central value of Ccf and Ccfmin represents the minimum value of Ccf.

It can be seen that the variation of capacitance Ccf between control gate 9 and floating gate 3 is also ±10%. Assuming that the coupling ratio (Cp) in the present embodiment is Cp=0.65, the variation of capacitance Ccf between control gate 9 and floating gate 3 is within ±10% and the capacitance Cfs between the floating gate 3 and silicon semiconductor substrate 1 is constant, then the variation of coupling ratio (Cp) is from −4% to ±3% with respect to the central value of coupling ratio Cp=0.65, and therefore, it can be considered stable.

Further, let us estimate how much the exposed side walls of floating gate 3 of one memory cell 10 contribute to increase in capacitance Ccf between control gate 9 and floating gate 3. Capacitance Ccf between control gate 9 and floating gate 3 when the areas of the side walls are utilized will be referred to as Ccf1. The capacitance Ccf between control gate 9 and floating gate 3 to be compared represents the capacitance when the areas of side walls are not at all utilized, which will be referred to as Ccf2. The following appropriate values are substituted for the film thicknesses.

$X_2$=500 nm: width of floating gate 3 of the memory cell

D=250 nm: thickness of floating gate 3

O=10 nm: thickness of thin oxide film 16 of FIG. 6

When calculated in accordance with equation (3), the relation between Ccf1 and Ccf2 is Ccf1=1.58×Ccf2. This means that the capacitance Ccf between control gate 9 and floating gate 3 is increased as much as about 60%.

The increase in coupling ratio (Cp) when capacitance Ccf between control gate 9 and floating gate 3 is increased by 58% will be calculated. The coupling ratio before the increase of capacitance Ccf between control gate 9 and floating gate 3, that is, coupling ratio Cp1 when the side walls of floating gate 3 are not utilized is now assumed to be Cp1=0.50, for example. Then, the coupling ratio Cp2 after the increase of capacitance Ccf between control gate 9 and floating gate 3 is 1.22×Cp1. It can be seen that the coupling ratio is increased by about 20%.

Second Embodiment

Figure 11:
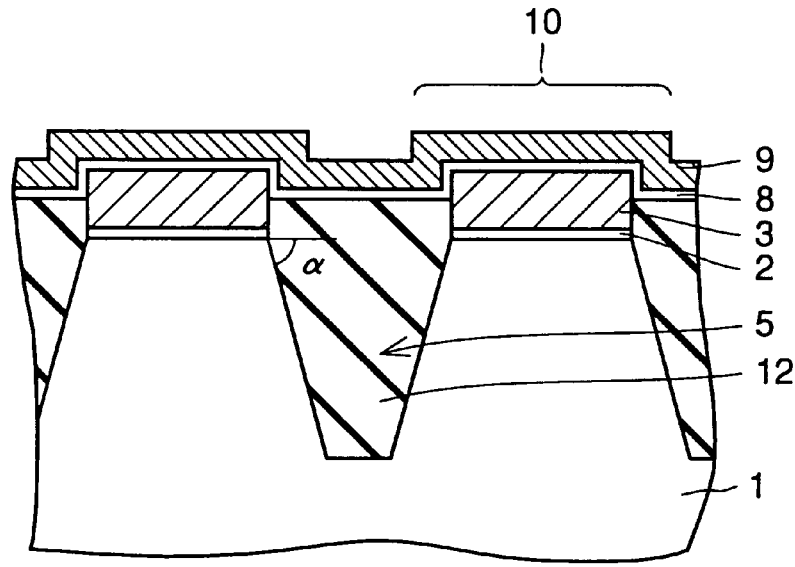
FIG. 11 is a cross section of a nonvolatile semiconductor memory device in accordance with a second embodiment.
Figure 12:
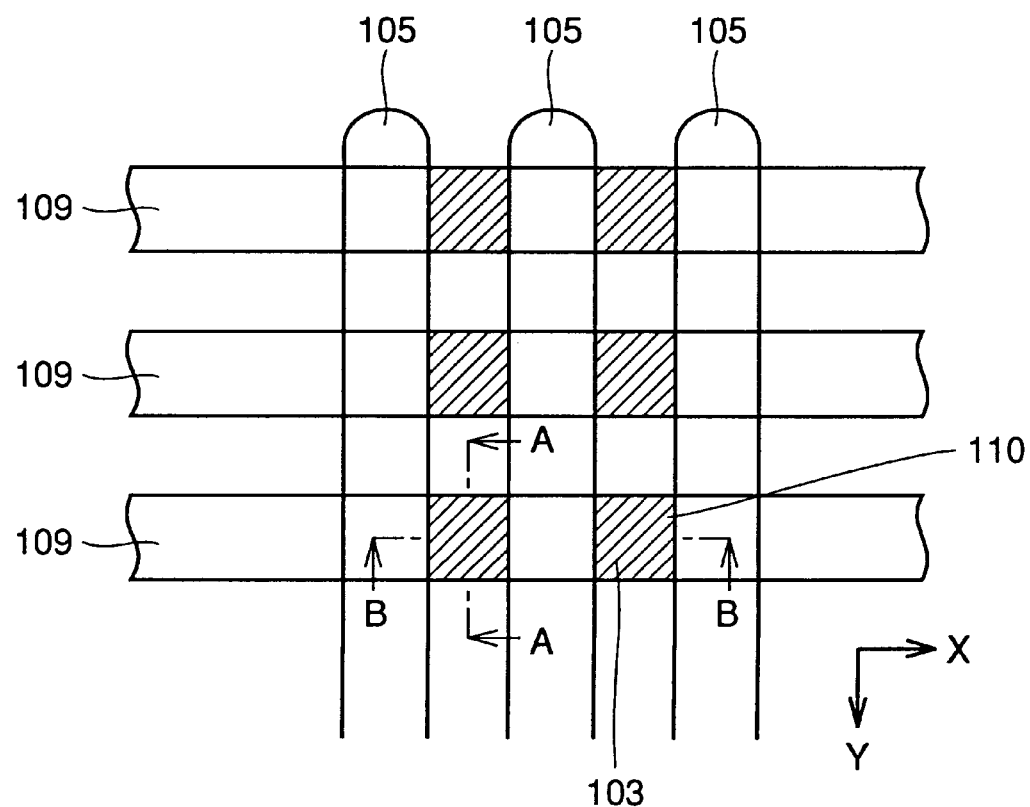
FIG. 12 is a plane view of a conventional nonvolatile semiconductor memory device with trench isolation.
Figure 13:
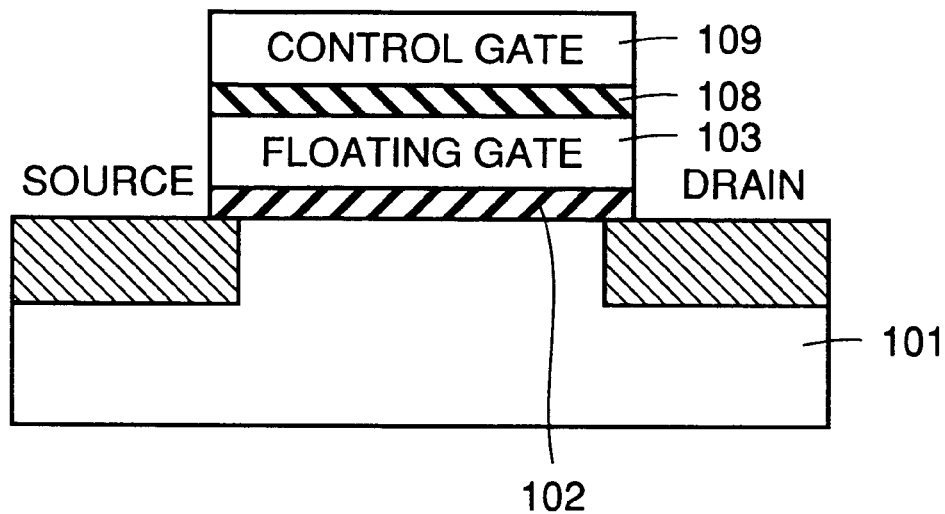
FIG. 13 is a cross section taken along the line A—A of FIG. 12.
Figure 14:
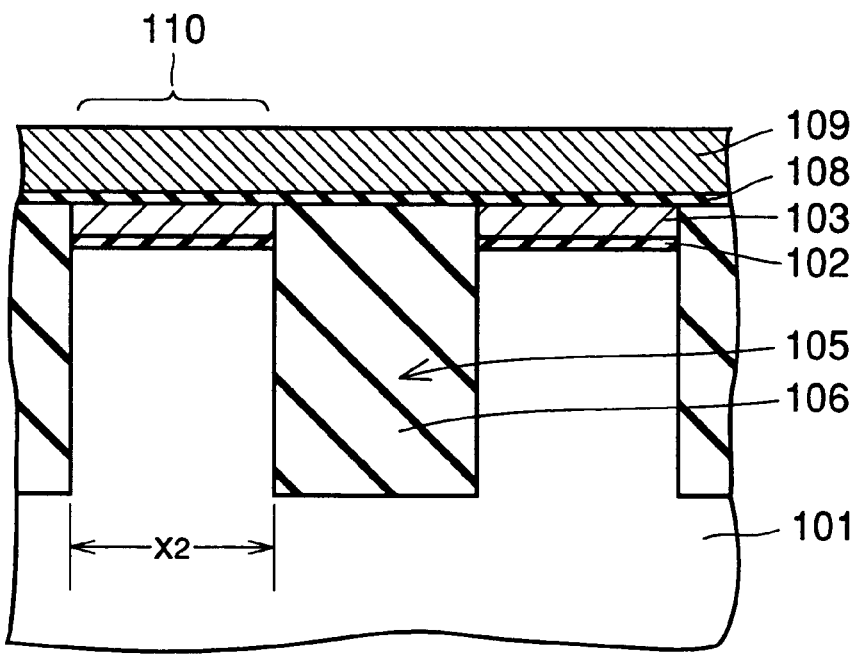
FIG. 14 is a cross section taken along the line B—B of FIG. 12.
Figure 15C:
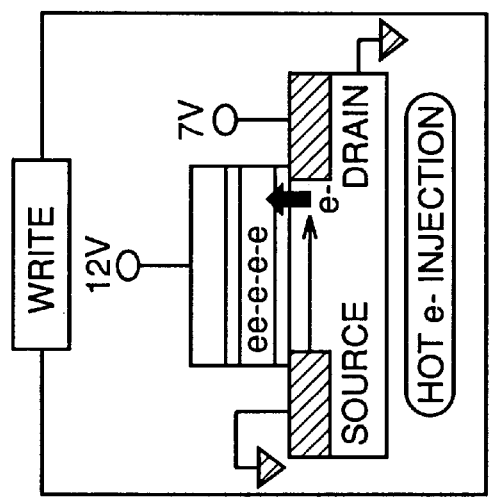
FIGS. 15A to 15C are illustrations showing the operation of the conventional nonvolatile semiconductor memory device.
Figure 15B:
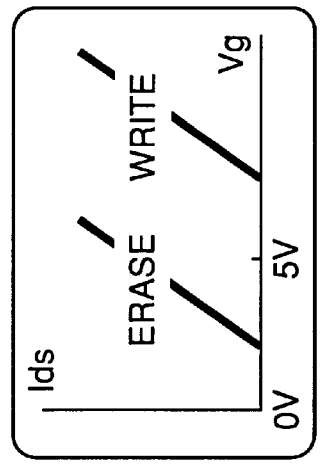
Figure 15A:
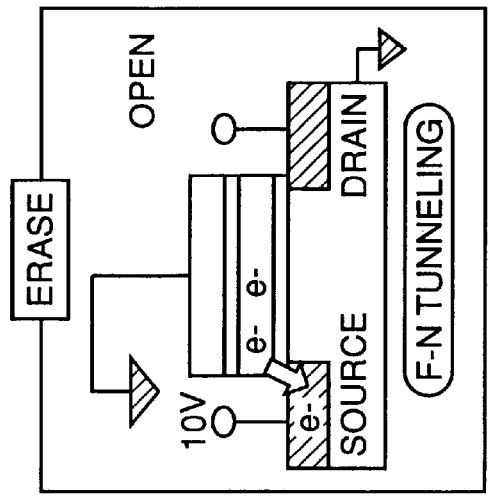
Figure 16:
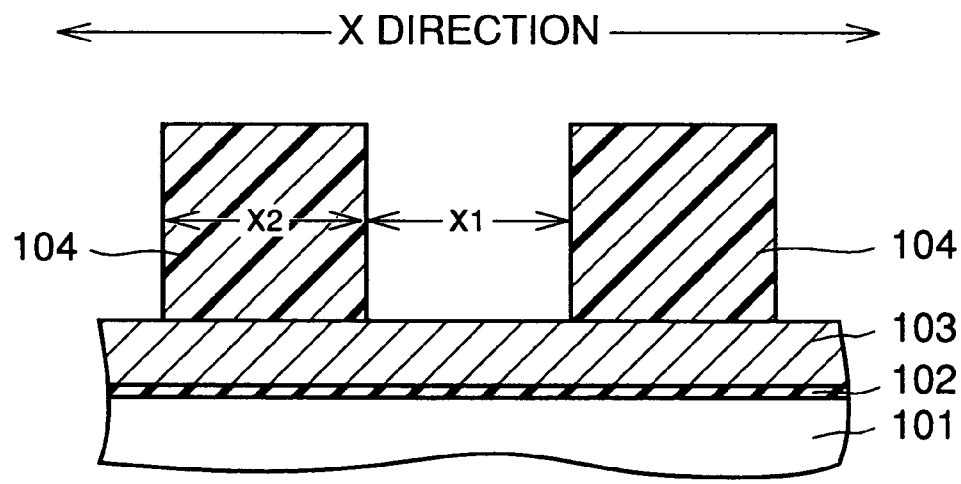
FIGS. 16 to 21 are cross sections showing a semiconductor device showing the first to sixth steps of the method of manufacturing the nonvolatile semiconductor memory device in accordance with the first prior art example.
Figure 17:
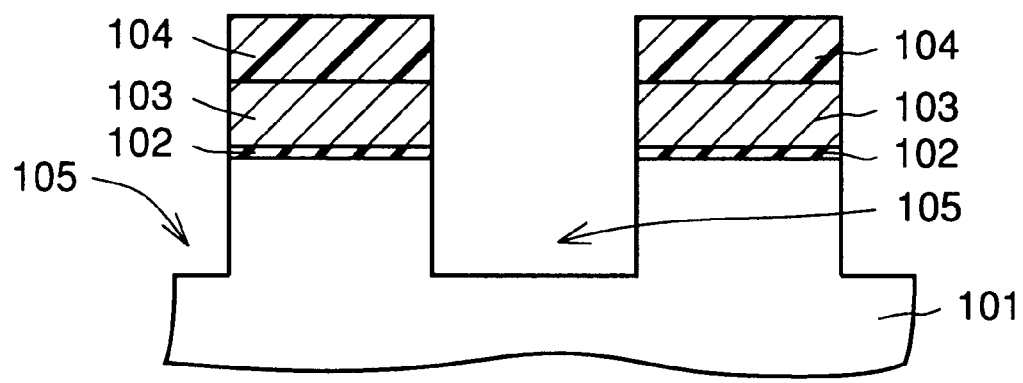
Figure 18:
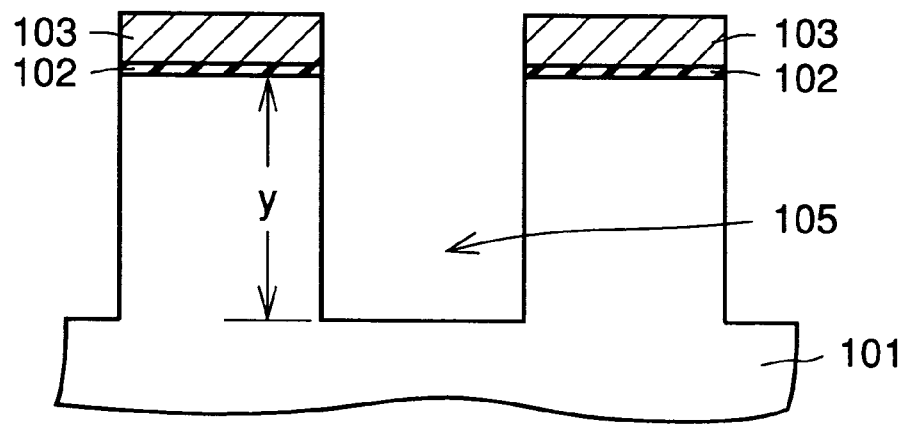
Figure 19:
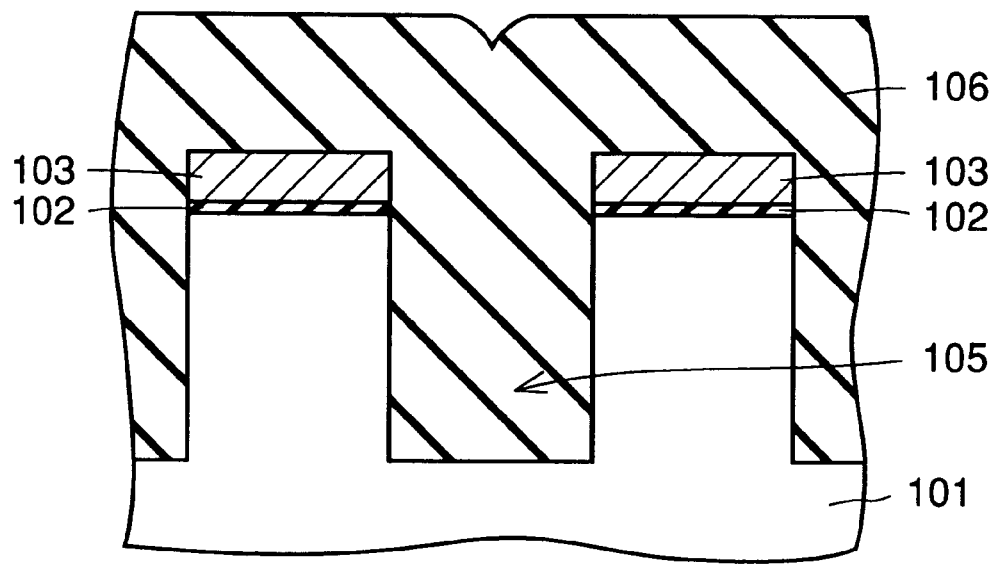
Figure 20:
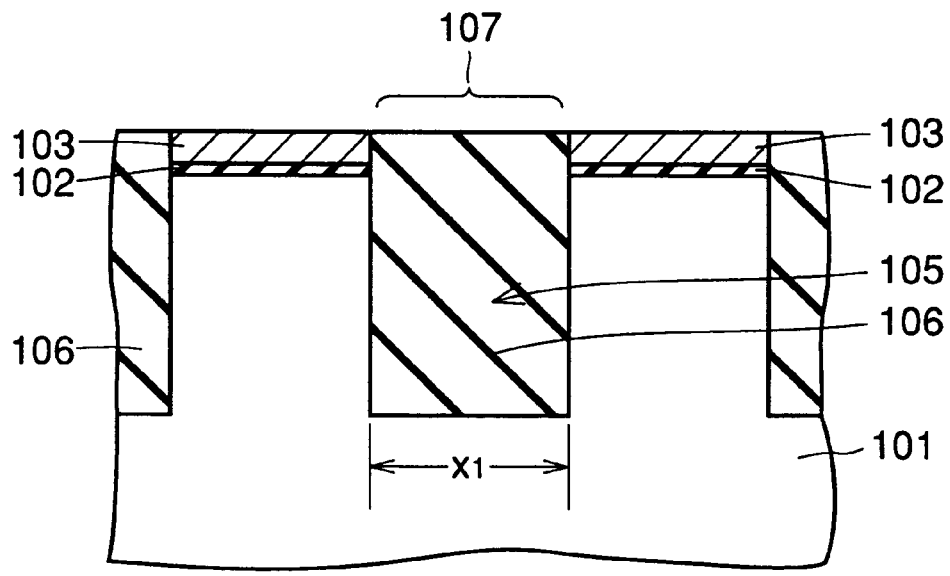
Figure 21:
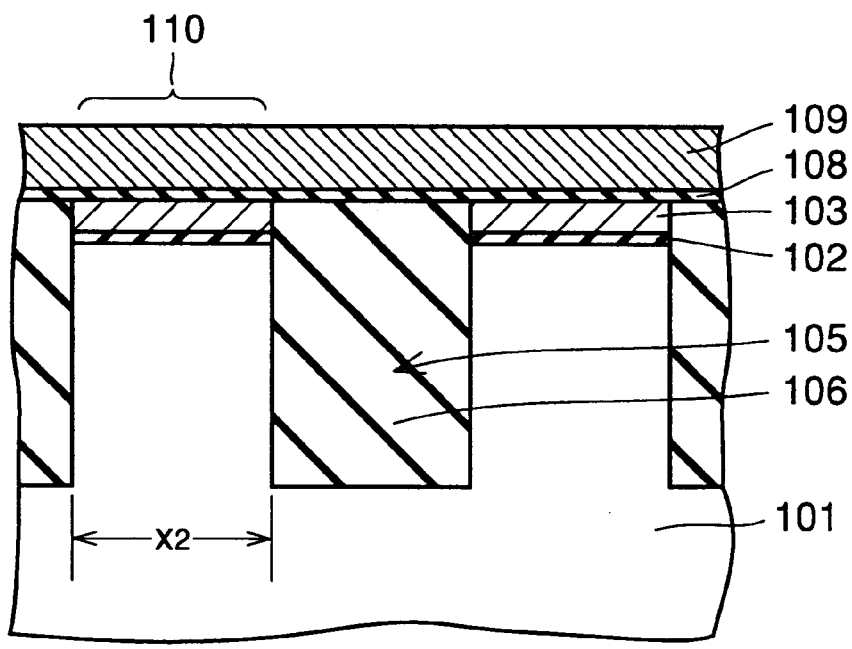
Figure 22:
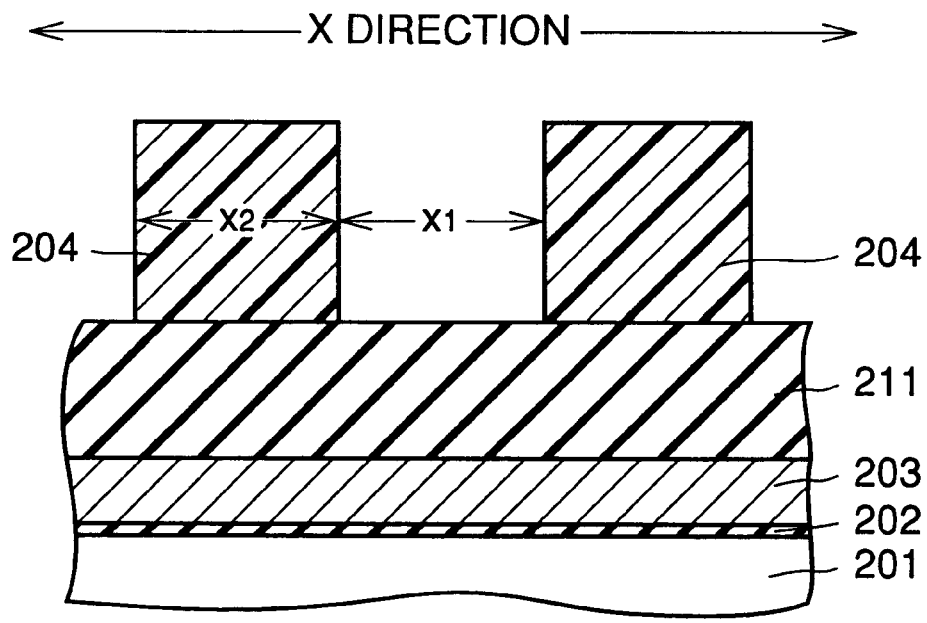
FIGS. 22 to 29 are cross sections of a semiconductor device showing the first to eighth steps of the method of manufacturing the nonvolatile semiconductor memory device in accordance with a second prior art example.
Figure 23:
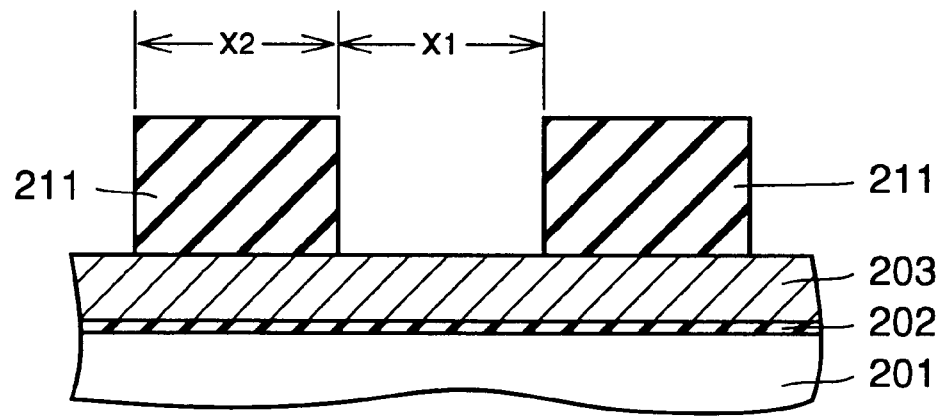
Figure 24:
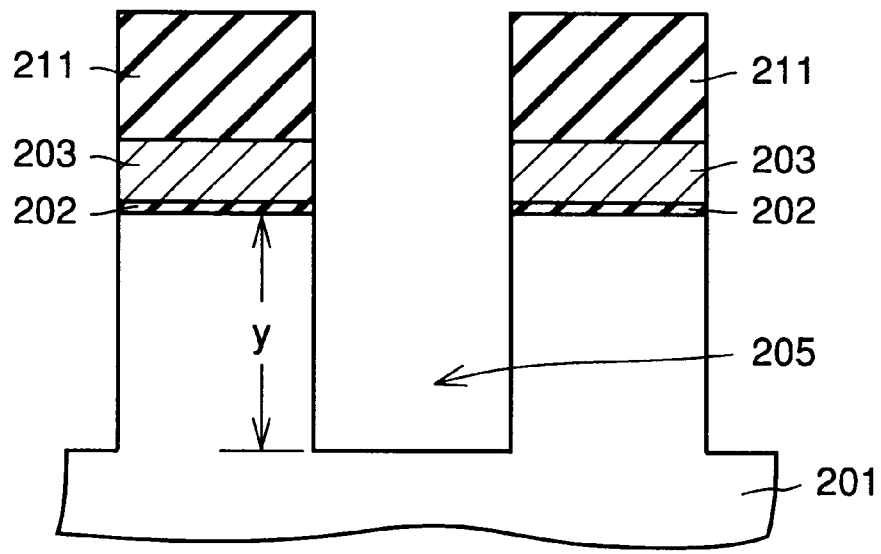
Figure 25:
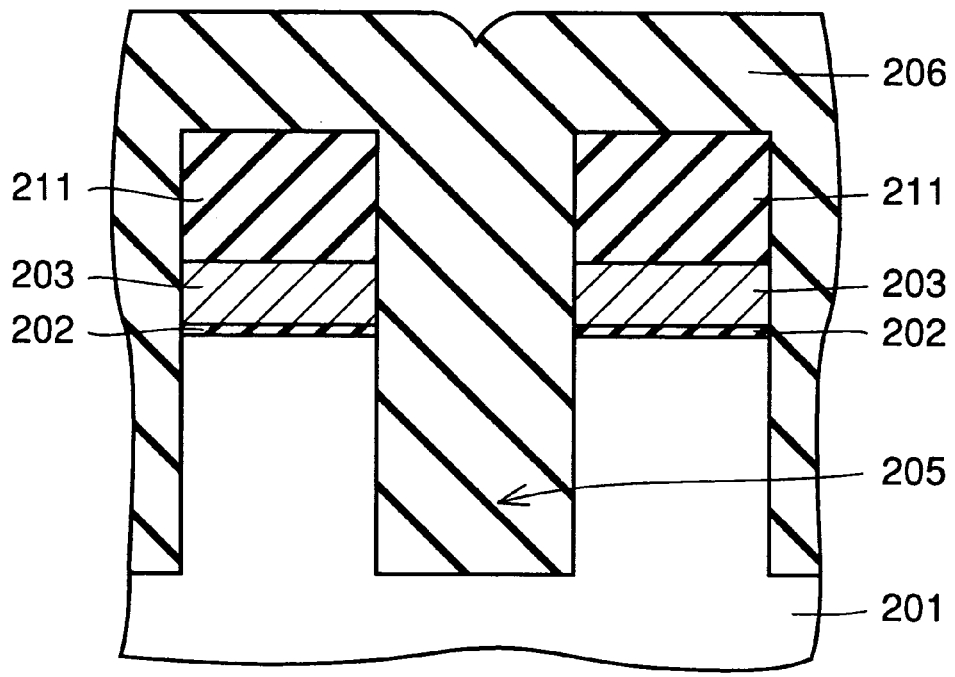
Figure 26:
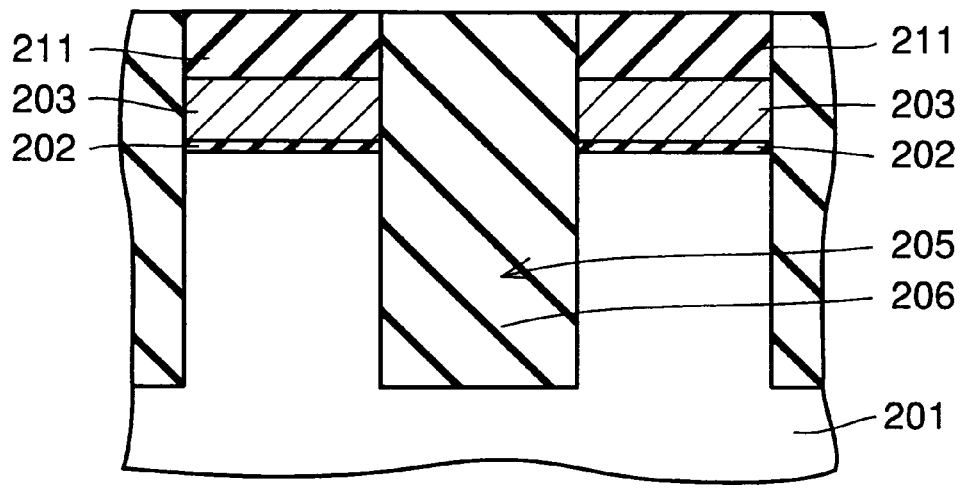
Figure 27:
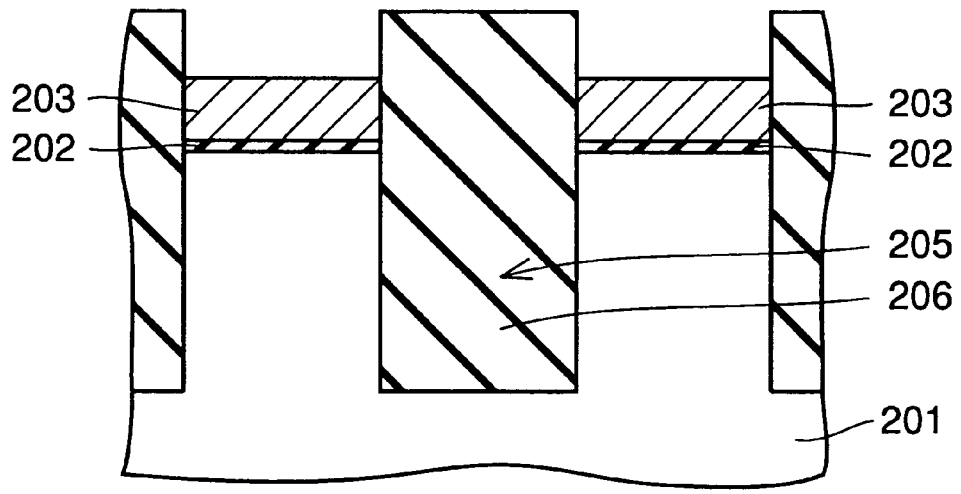
Figure 28:
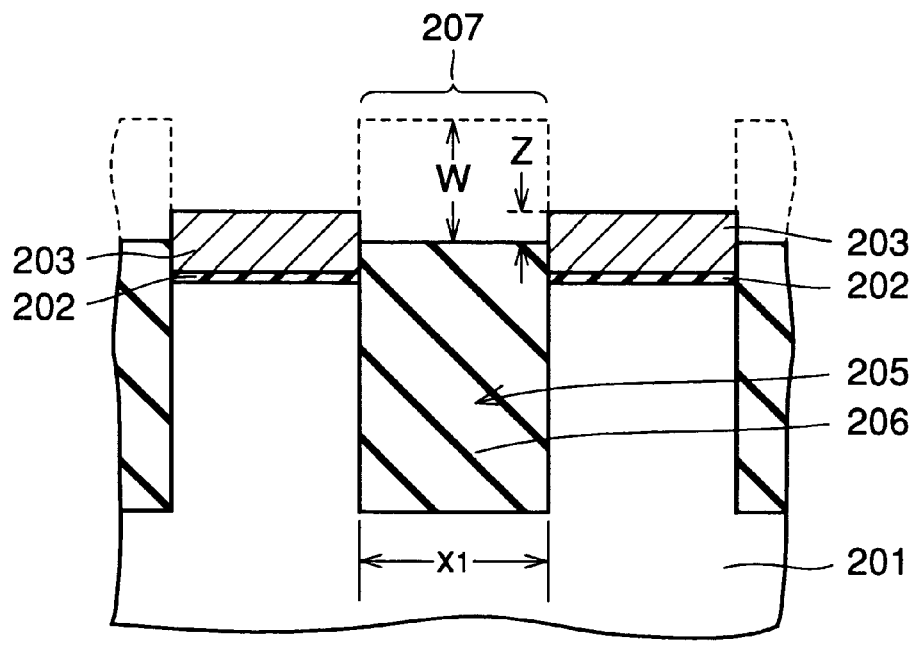
Figure 29:
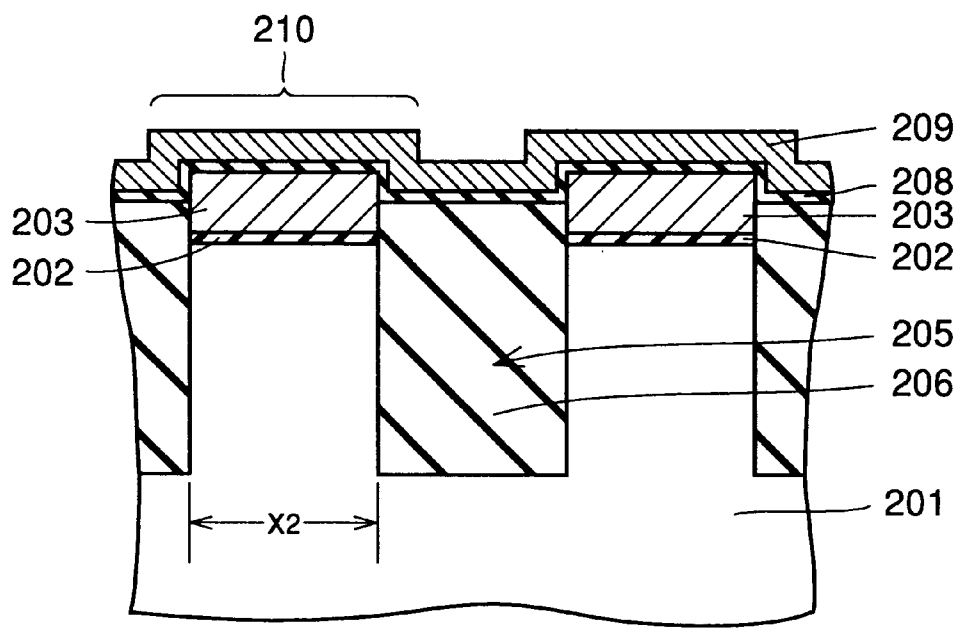
Figure 30:
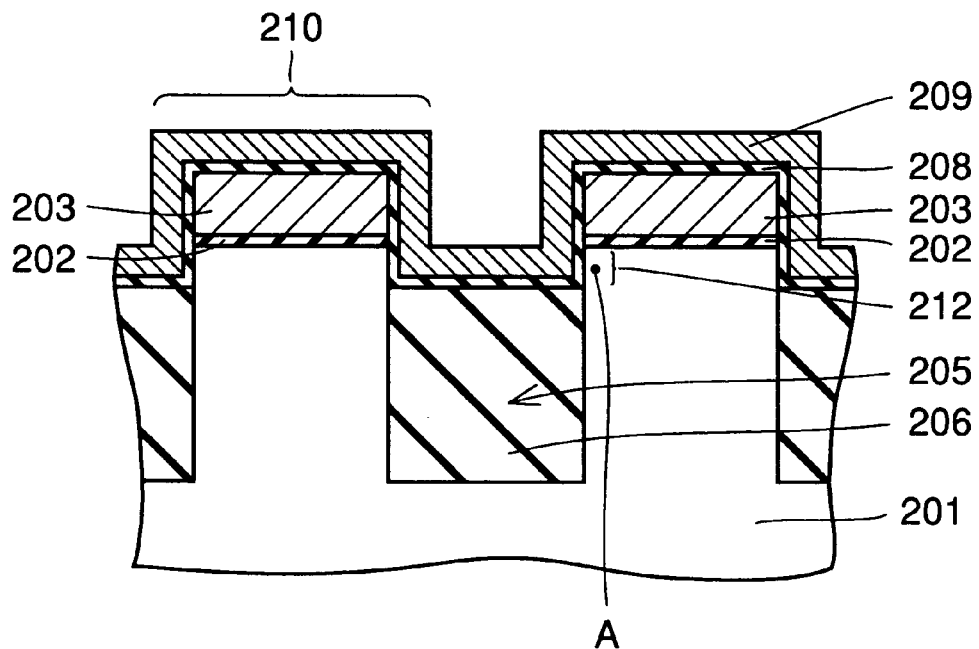
FIG. 30 shows a problem in the method of manufacturing the nonvolatile semiconductor memory device in accordance with the second prior art example.
Figure 31:
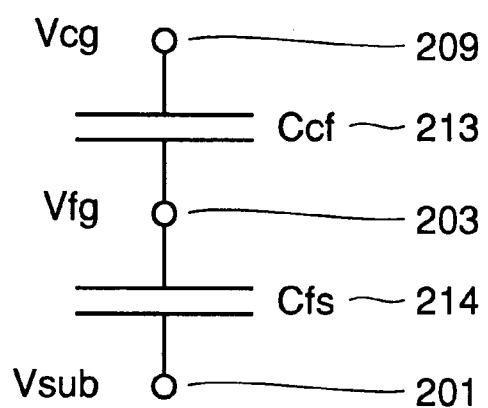
FIG. 31 is an equivalent circuit diagram of a memory cell in the nonvolatile semiconductor memory device in accordance with the second prior art example.

FIG. 11 is a cross section of a nonvolatile semiconductor memory device in accordance with a second embodiment.

Referring to FIG. 11, the nonvolatile semiconductor memory device in accordance with the second embodiment includes a silicon semiconductor substrate 1. At the main surface of silicon semiconductor substrate 1, there is a trench 5 for trench isolation formed as a line. A thick oxide film 12 is formed on silicon semiconductor substrate 1 to fill trench 5. On the semiconductor substrate on both sides of trench 5, a floating gate 3 is provided with a tunnel oxide film 2 interposed. On floating gate 3, a control gate 9 is provided with an interpoly insulation film 8 interposed.

Referring to FIG. 10, when the angle formed by the side wall surface of trench 5 and surface of semiconductor substrate 1 is a right angle, it is difficult for the thick oxide film 6 to fill trench 5. This may lead to a cavity or a narrow and deep gap at the center of thick oxide film 6. Such cavity or gap is made deeper at the time of cleaning the floating gate 3 by hydrofluoric acid solution before the subsequent deposition of interpoly insulation film 8, and it becomes impossible to remove the control gate 9 which has entered the deep gap by etching.

Eventually, adjacent control gates would be rendered electronically conductive. As a result, all the control gates of the memory cell array come to have the same voltage, preventing proper operation of each memory cell.

In accordance with the device of the second embodiment, the angle formed by the side wall surface of trench 5 and the surface of silicon semiconductor substrate 1 is smaller than 90°. Therefore, it becomes easy to fill trench 5 with thick oxide film 12. Therefore, the above described problems can be prevented.

The method of manufacturing the nonvolatile semiconductor memory device shown in FIG. 11 is almost the same as the method of manufacturing the device in accordance with the first embodiment shown in FIGS. 1 to 10. However, the step of successively etching thin polycrystalline silicon film 15, thin oxide film 16, floating gate 3, tunnel oxide film 2 and silicon semiconductor substrate 1 using silicon nitride film 11 as a mask shown in FIG. 3 is different. In the second embodiment, using silicon nitride film 11 as a hard mask, thin polycrystalline silicon film 15, thin oxide film 16, floating gate 3 and tunnel oxide film 2 are successively etched in self alignment with silicon nitride film 11 and vertical to silicon semiconductor substrate 1. However, subsequent etching of silicon semiconductor substrate 1 is performed not vertical to the silicon semiconductor substrate 1 but with an angle a smaller than 90°, as shown in FIG. 11. When the trench is formed in silicon semiconductor substrate 1 with an angle a smaller than 90°, filling of trench 5 with thick oxide film in the step of FIG. 4 can be performed without any problem.

According to this method, even when the thick oxide film is formed by LPCVD (Low Pressure Chemical Vapor Deposition) having inferior coverage, cavity or deep and narrow gap are not formed at the center of the thick oxide film.

In the second embodiment, thin polycrystalline silicon film 15, thin oxide film 16, floating gate 3 and tunnel oxide film 2 are etched vertical to silicon semiconductor substrate 1. However, when these are etched not vertical but with an angle with respect to silicon semiconductor substrate 1, filling of trench 5 with thick oxide film 12 is further facilitated. However, after control gate 9 is etched using interpoly insulation film 8 as a stopper film, when interpoly insulation film 8 and floating gate 3 exposed at the portion where control gate 9 has been etched and removed are to be etched, the thick oxide film 12 of which upper surface is positioned between the upper and lower surfaces of floating gate 3 serves as the etching mask for the floating gate 3. Then floating gate 3 of adjacent memory cells come to be electrically conducted to each other, floating gate voltages of the memory cell allay come to have the same values, and each memory cell can not operate properly.

Therefore, it is preferred to etch thin polycrystalline silicon film 15, thin oxide film 16, floating gate 3 and tunnel oxide film 2 successively vertical to silicon semiconductor substrate, and etch silicon semiconductor substrate 1 with an angle α smaller than 90°, using silicon nitride film 11 as a hard mask. As a result, a nonvolatile semiconductor memory device in which memory cell alley as a whole operate normally is provided.

According to the first aspect, in the nonvolatile semiconductor memory device, the angle formed by the side wall surface of the trench and the upper surface of the semiconductor substrate is smaller than 90°, so that the trench can be filled by thick oxide film easily. Thus normally operating semiconductor device is provided.

According to the second aspect, in the nonvolatile semiconductor memory device, the first oxide film is formed of a material containing an oxide of the same element as the element mainly constituting the semiconductor substrate. Therefore, it can be formed by a general method of oxidation such as thermal oxidation.

According to the third aspect, in the nonvolatile semiconductor memory device, the first oxide film is formed of $SiO_2$ or a material containing $SiO_2$. Therefore, it can be formed by a general method such as thermal oxidation.

According to the fourth aspect, in the nonvolatile semiconductor memory device, the first oxide film is formed of $SiO_xN_y$ or a material containing $SiO_xN_y$.

According to the fifth aspect, in the nonvolatile semiconductor memory device, the second insulating film is formed of a material containing an oxide of the same element as the element mainly constituting the semiconductor substrate, a material containing a nitride of the same element as the element mainly constituting the semiconductor substrate, or a stacked film of a material containing an oxide of the same element as the main element constituting the semiconductor substrate and a material containing a nitride of the same element as the main element constituting the semiconductor substrate.

Therefore, it can be formed by a generally used method.

According to the sixth aspect, in the nonvolatile semiconductor memory device, the second insulating film is formed of a material containing $SiO_2$, a material containing $Si_xN_y$ or a stacked film of a material containing $SiO_2$ and a material containing $Si_xN_y$. Therefore, it can be formed by a conventional general method.

According to the seventh aspect, in the nonvolatile semiconductor memory device, the first insulating film does not contain any impurity providing conductivity to the semiconductor substrate. Therefore, a nonvolatile semiconductor memory device operating properly can be obtained.

According to the eighth aspect, in the nonvolatile semiconductor memory device, the position of a portion where the first insulating film is in contact with the side wall of the first gate electrode is below the upper surface of the first gate electrode and above the lower surface of the first gate electrode. Therefore, a parasitic transistor is not formed.

According to the ninth aspect, in the method of manufacturing the nonvolatile semiconductor memory device, a nonvolatile semiconductor memory device with trench isolation having sufficient capability of isolating memory cells can be obtained.

According to the tenth aspect, the upper surface of floating gate and inner portion of floating gate near the upper surface are not damaged by the method of manufacturing the nonvolatile semiconductor memory device.

According to the eleventh aspect, in the method of manufacturing the nonvolatile semiconductor memory device, the thin oxide film is not removed at the time of silicon dry etching.

According to the twelfth aspect, in the method of manufacturing the nonvolatile semiconductor memory device, the semiconductor thin film can be formed by a generally used material.

According to the thirteenth aspect, in the method of manufacturing the nonvolatile semiconductor memory device, the surface of the first insulating film can be removed by a general method of grinding.

According to the fourteenth aspect, by the method of manufacturing the nonvolatile semiconductor memory device, a nonvolatile semiconductor memory device which can prevent damage to the upper surface of floating gate and inner portion of floating gate near the upper surface can be obtained.

According to the fifteenth aspect, in the method of manufacturing the nonvolatile semiconductor memory device, a nitride of the same element as the element mainly constituting the semiconductor substrate is used as the inorganic substance as the material of the etching mask. Therefore, the inside of the trench is not contaminated by carbon or the like.

According to the sixteenth aspect, by the method of manufacturing the nonvolatile semiconductor memory device, the inside of the trench is not contaminated by carbon or the like.

According to the seventeenth aspect, by the method of manufacturing the nonvolatile semiconductor memory device, deposition of the first insulating film can be done by a generally used method.

According to the eighteenth aspect, by the method of manufacturing the nonvolatile semiconductor memory device, a nonvolatile semiconductor memory device not having a parasitic transistor can be obtained.

According to the nineteenth aspect, by the method of manufacturing the nonvolatile semiconductor memory device, filling of the trench with the thick oxide film is facilitated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device using trench isolation, comprising:

a silicon semiconductor substrate;

a trench for said trench isolation formed as a line in a main surface of said semiconductor substrate;

a first insulating film provided on said semiconductor substrate to fill said trench;

a first gate electrode provided on said semiconductor substrate on both sides of said trench with a first oxide film interposed; and a second gate electrode formed on said first gate electrode with a second insulating film interposed therebetween; wherein an angle formed by a side wall surface of said trench and an upper surface of said semiconductor substrate is smaller than 90° C.; and said first oxide film is formed of $SiO_xN_y$ or a material containing $SiO_xN_y$.

2. The nonvolatile semiconductor memory device according to claim 1, wherein said second insulating film is formed of a material containing an oxide of same element as a main element constituting said semiconductor substrate, a material containing a nitride of same element as a main element constituting said semiconductor substrate, or a stacked film of a material containing an oxide of same element as a main element constituting said semiconductor substrate and a material containing a nitride of a main element constituting said semiconductor substrate.

3. The nonvolatile semiconductor memory device according to claim 2, wherein said second insulating film is formed of a material containing $SiO_2$, a material containing $Si_xN_y$, or a stacked film of a material containing $SiO_2$ and a material containing $Si_xN_y$.

4. The nonvolatile semiconductor memory device according to claim 1, wherein said first insulating film does not contain any impurity providing conductivity to said semiconductor substrate.

5. The nonvolatile semiconductor memory device according to claim 1, wherein a portion where said first insulating film is in contact with a side wall of said first gate electrode is below an upper surface of said first gate electrode and above a lower surface of said first gate electrode.

6. A nonvolatile semiconductor memory device using trench isolation, comprising:

a silicon semiconductor substrate;

a trench for said trench isolation formed as a line in a main surface of said semiconductor substrate;

a first insulating film provided on said semiconductor substrate to fill said trench;

a first gate electrode provided on said semiconductor substrate on both sides of said trench with a first oxide film interposed; and a second gate electrode formed on said first gate electrode with a second insulating film interposed therebetween; wherein the width of said trench becomes narrower in the direction of a bottom of the trench, and said first oxide film is formed of $SiO_xN_y$ or a material containing $SiO_xN_y$.

* * * * *

UNITED STATES PATENT AND TRADEMARK OFFICE
CERTIFICATE OF CORRECTION

PATENT NO. : 6,034,393
DATED : March 7, 2000
INVENTOR(S) : Osamu SAKAMOTO, et al.

It is certified that error appears in the above-identified patent and that said Letter Patent is hereby corrected as shown below:

In the Claims:

Column 26, Line 11, replace "90° C" with --90°--.

Signed and Sealed this

Third Day of April, 2001

Attest:

NICHOLAS P. GODICI

*Attesting Officer*   *Acting Director of the United States Patent and Trademark Office*